(12) United States Patent
Yamazawa et al.

(10) Patent No.: US 8,608,903 B2
(45) Date of Patent: *Dec. 17, 2013

(54) PLASMA PROCESSING APPARATUS AND PLASMA PROCESSING METHOD

(75) Inventors: Yohei Yamazawa, Nirasaki (JP); Chishio Koshimizu, Nirasaki (JP); Masashi Saito, Nirasaki (JP); Kazuki Denpoh, Nirasaki (JP); Jun Yamawaku, Nirasaki (JP); Hachishiro Iizuka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 301 days.

This patent is subject to a terminal disclaimer.

(21) Appl. No.: 12/913,135

(22) Filed: Oct. 27, 2010

(65) Prior Publication Data

US 2011/0094995 A1    Apr. 28, 2011

Related U.S. Application Data

(60) Provisional application No. 61/265,523, filed on Dec. 1, 2009, provisional application No. 61/265,545, filed on Dec. 1, 2009.

(30) Foreign Application Priority Data

Oct. 27, 2009   (JP) ................ 2009-245988
Oct. 27, 2009   (JP) ................ 2009-245991
Sep. 27, 2010   (JP) ................ 2010-215111

(51) Int. Cl.
*H01L 21/306*    (2006.01)
*C23C 16/00*     (2006.01)

(52) U.S. Cl.
USPC ............. 156/345.48; 118/723 I; 118/723 IR; 118/723 AN

(58) Field of Classification Search
USPC ....... 118/723 I, 723 IR, 723 AN; 156/345.48, 156/345.49; 315/111.51
See application file for complete search history.

(56) References Cited

U.S. PATENT DOCUMENTS 5,109,790 A * 5/1992 Matsumoto et al. ............ 118/63
5,280,154 A * 1/1994 Cuomo et al. ............ 219/121.52

(Continued)

FOREIGN PATENT DOCUMENTS

CN   1055495 A   10/1991
CN   1392754 A   1/2003

(Continued)

OTHER PUBLICATIONS

U.S. Office Action mailed Mar. 22, 2013 in co-pending U.S. Appl. No. 12/913,162.

(Continued)

*Primary Examiner* — Luz Alejandro Mulero
(74) *Attorney, Agent, or Firm* — Rothwell, Figg, Ernst & Manbeck, P.C.

(57) ABSTRACT

A plasma processing apparatus includes: a processing chamber including a dielectric window; a coil-shaped RF antenna, provided outside the dielectric window; a substrate supporting unit, provided in the chamber, for mounting thereon a target substrate; a processing gas supply unit for supplying a processing gas to the chamber; and an RF power supply unit for supplying an RF power to the RF antenna to generate a plasma of the processing gas by an inductive coupling in the chamber. The apparatus further includes a correction coil, provided at a position outside the chamber where the correction coil is to be coupled with the RF antenna by an electromagnetic induction, for controlling a plasma density distribution in the chamber; and an antenna-coil distance control unit for controlling a distance between the RF antenna and the correction coil while supporting the correction coil substantially in parallel with the RF antenna.

13 Claims, 20 Drawing Sheets

(56) References Cited

U.S. PATENT DOCUMENTS

| | | | |
|---|---|---|---|
| 5,401,350 A | 3/1995 | Patrick et al. | |
| 5,620,523 A * | 4/1997 | Maeda et al. | 118/723 IR |
| 5,637,961 A | 6/1997 | Ishii et al. | |
| 5,731,565 A | 3/1998 | Gates | |
| 5,800,619 A | 9/1998 | Holland et al. | |
| 5,907,221 A | 5/1999 | Sato et al. | |
| 5,919,382 A * | 7/1999 | Qian et al. | 219/121.52 |
| 6,016,131 A | 1/2000 | Sato et al. | |
| 6,229,264 B1 * | 5/2001 | Ni et al. | 315/111.51 |
| 6,252,354 B1 | 6/2001 | Collins et al. | |
| 6,876,155 B2 | 4/2005 | Howald et al. | |
| 2002/0041160 A1 * | 4/2002 | Barnes et al. | 315/111.21 |
| 2002/0189763 A1 | 12/2002 | Kwon et al. | |
| 2003/0145952 A1 | 8/2003 | Wilcoxson et al. | |
| 2004/0085246 A1 | 5/2004 | Howald et al. | |
| 2004/0216676 A1 | 11/2004 | Wilcoxson et al. | |
| 2004/0223579 A1 | 11/2004 | Lee et al. | |
| 2005/0205211 A1 * | 9/2005 | Singh et al. | 156/345.48 |
| 2007/0256787 A1 * | 11/2007 | Chandrachood et al. | 156/345.48 |
| 2008/0185284 A1 | 8/2008 | Chen et al. | |

FOREIGN PATENT DOCUMENTS

| | | |
|---|---|---|
| CN | 1537405 A | 10/2004 |
| CN | 1689132 A | 10/2005 |
| CN | 101304630 A | 11/2008 |
| JP | 7-122397 A | 5/1995 |
| JP | 8-162288 A | 6/1996 |
| JP | 2001-52894 A | 2/2001 |
| JP | 2003-517197 | 5/2003 |
| JP | 2003-273028 A | 9/2003 |
| JP | 2004-537830 | 12/2004 |
| JP | 2005-534150 | 11/2005 |

OTHER PUBLICATIONS

U.S. Office Action mailed Oct. 17, 2013 in co-pending U.S. Appl. No. 12/913,441 (26 pages).

* cited by examiner

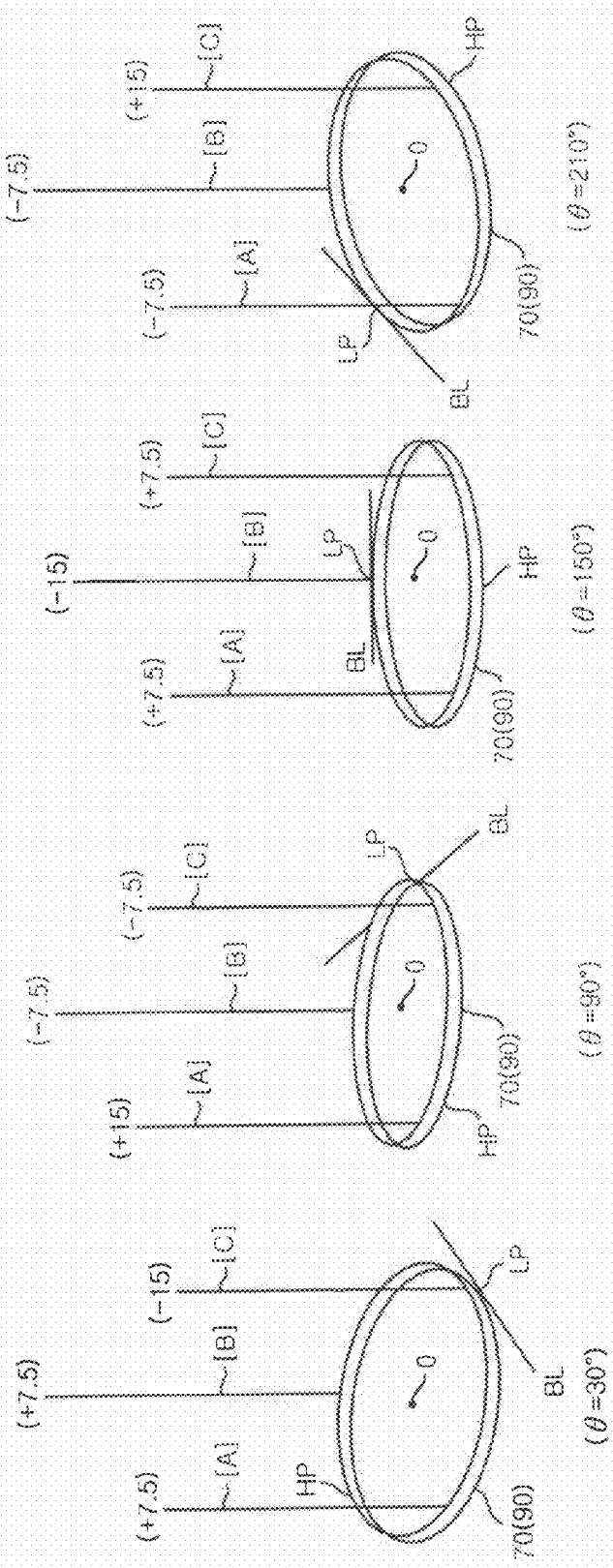

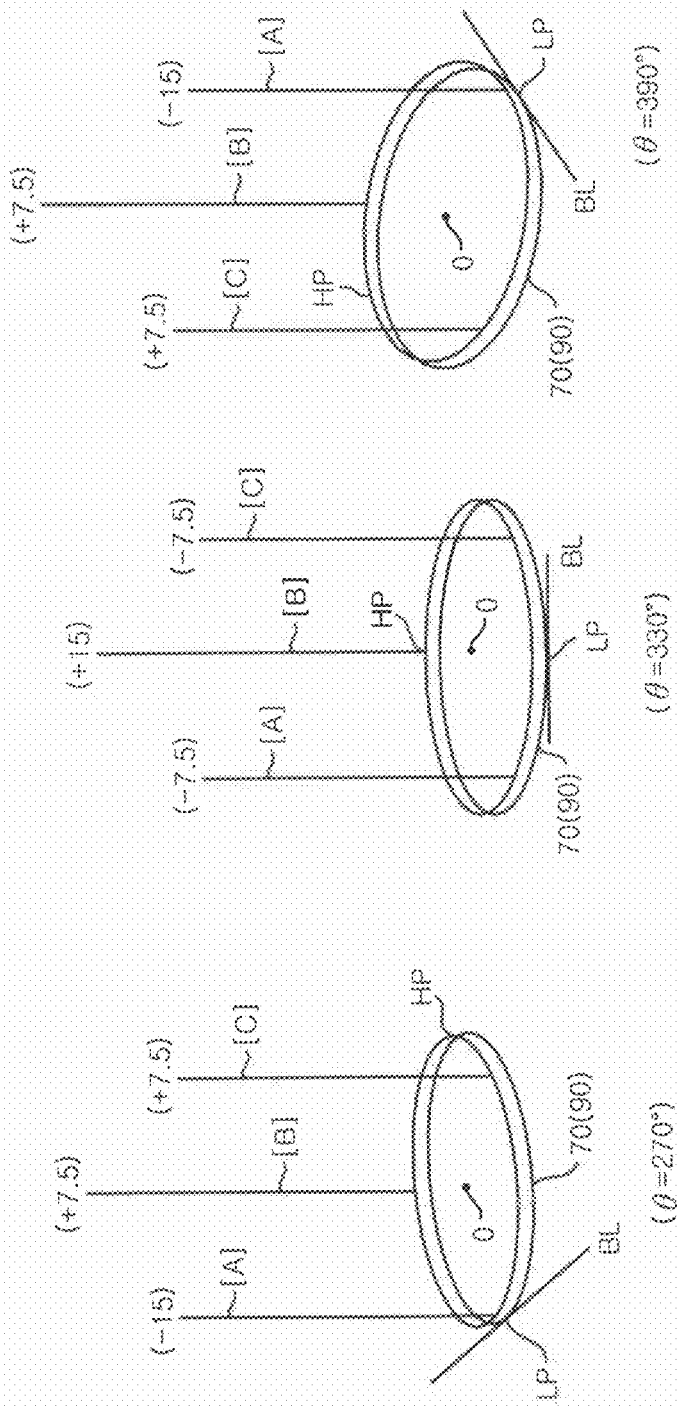

PLASMA PROCESSING APPARATUS AND PLASMA PROCESSING METHOD

CROSS-REFERENCE TO RELATED APPLICATIONS

This application claims priority to Japanese Patent Application Nos. 2009-245988 and 2009-245991 filed on Oct. 27, 2009 and 2010-215111 filed on Sep. 27, 2010 and U.S. Provisional Application Nos. 61/265,545 and 61/265,523 filed on Dec. 1, 2009, the entire contents of which are incorporated herein by reference.

FIELD OF THE INVENTION

The present invention relates to a technique for performing a plasma process on a target substrate to be processed; and, more particularly, to an inductively coupled plasma processing apparatus and a plasma processing method therefor.

BACKGROUND OF THE INVENTION

In the manufacturing process of a semiconductor device or a flat panel display (FPD), a plasma is widely used in a process such as etching, deposit, oxidation, sputtering or the like since it has a good reactivity with a processing gas at a relatively low temperature. In such plasma process, the plasma is mostly generated by a radio frequency (RF) discharge in the megahertz range. Specifically, the plasma generated by the RF discharge is classified into a capacitively coupled plasma and an inductively coupled plasma.

Typically, an inductively coupled plasma processing apparatus includes a processing chamber, at least a portion (e.g., a ceiling portion) of which is formed of a dielectric window; and a coil-shaped RF antenna provided outside the dielectric window, and an RF power is supplied to the RF antenna. The processing chamber serves as a vacuum chamber capable of being depressurized, and a target substrate (e.g., a semiconductor wafer, a glass substrate or the like) to be processed is provided at a central portion of the chamber. Further, a processing gas is introduced into a processing space between the dielectric window and the substrate. As an RF current flows though the RF antenna, an RF magnetic field is generated around the RF antenna, wherein magnetic force lines of the RF magnetic field travel through the dielectric window and the processing space. The temporal alteration of the generated RF magnetic field causes an electric field to be induced azimuthally. Moreover, electrons azimuthally accelerated by the induced electric field collide with molecules and/or atoms of the processing gas, to thereby ionize the processing gas and generate a plasma in a doughnut shape.

By increasing the size of the processing space in the chamber, the plasma is efficiently diffused in all directions (especially, in the radial direction), thereby making the density of the plasma on the substrate uniform. However, the uniformity of the plasma density on the substrate that is obtained by merely using a typical RF antenna is generally insufficient for the plasma process. Accordingly, even as for the inductively coupled plasma processing apparatus, it becomes one of the most important factors to improve the uniformity of the plasma density on the substrate, since it determines the uniformity and the reproducibility of the plasma process itself and, furthermore, the manufacturing production yield. Several techniques related thereto have been so far proposed.

In a representative conventional technique for improving the uniformity of the plasma density, the RF antenna is divided into a plurality of segments. Such RF antenna dividing method includes a first method for individually supplying RF powers to the respective antenna segments (see, e.g., U.S. Pat. No. 5,401,350); and a second method for controlling the division ratio of the RF powers that are divided from one RF power supply to all the antenna segments by changing each impedance of the antenna segments in an additional circuit such as a capacitor or the like (see, e.g., U.S. Pat. No. 5,907,221).

In addition, there has been known a method in which a single RF antenna is used and a passive antenna is provided around the RF antenna (see, e.g., Japanese Patent Application Publication No. 2005-534150 (JP2005-534150A)). The passive antenna is formed of an independent coil to which an RF power is not supplied from the RF power supply. The passive antenna acts to decrease the intensity of the magnetic field in the loop of the passive antenna compared to that of the magnetic field generated by the RF antenna (inductive antenna) and increase the intensity of the magnetic field outside the loop of the passive antenna. Accordingly, the radial distribution of the RF electromagnetic field in the plasma generating region in the chamber is changed.

However, the first method of the above-described RF antenna dividing methods is disadvantageous in that the requirement for a plurality of RF power supplies and a plurality of matchers corresponding thereto makes the configuration of the RF power supply unit complex and increases the costs remarkably. The second method is rarely used due to the poor controllability. To be specific, it is difficult to control the division ratio only by the additional circuit because each of impedances of the antenna segments is affected by the impedances of the plasma as well as other antennas segments.

In the conventional method using the passive antenna described in JP2005-534150A, the magnetic field generated by the RF antenna (inductive antenna) is affected by the passive antenna and, thus, the radial distribution of the RF electromagnetic field in the plasma generation region in the chamber can be changed. Since, however, the effect of the passive antenna has not been sufficiently examined to be understood enough, it is not easy to realize the specific configuration of the apparatus for accurately controlling the plasma density distribution by using the passive antenna.

Along with the trend toward scaling-up of a substrate and scaling-down of a device, the recent trend in the current plasma process has brought about the demand for high-density plasma sources with larger diameters at a low pressure. Therefore, it is difficult to improve the uniformity of the process on the substrate.

In this regard, the inductively coupled plasma processing apparatus generates a plasma in a doughnut shape inside the dielectric window close to the RF antenna and diffuses the plasma generated in the doughnut shape in all directions toward the substrate. However, the diffusion shape of the plasma is varied depending on the pressure inside the chamber, which results in changes in the plasma density distribution on the substrate. Hence, if it is not possible to correct the magnetic field generated by the RF antenna (inductive antenna) to maintain the uniformity of the plasma density on the substrate regardless of the changes in the pressure of the process recipe, it is difficult to cope with various and high process performances required by the current plasma processing apparatus.

SUMMARY OF THE INVENTION

In view of the above, the present invention provides an inductively coupled plasma processing apparatus and a plasma processing method therefor, capable of freely accurately controlling the plasma density distribution by using a simple correction coil without requiring special processing on the plasma-generating RF antenna or the RF power supply system.

In accordance with a first aspect of the present invention, there is provided a plasma processing apparatus. The apparatus includes a processing chamber including a dielectric window at a ceiling portion thereof; a coil-shaped RF antenna, provided outside the dielectric window; a substrate supporting unit, provided in the processing chamber, for mounting thereon a target substrate to be processed; a processing gas supply unit for supplying a desired processing gas to the processing chamber to perform a desired plasma process on the target substrate; an RF power supply unit for supplying an RF power to the RF antenna to generate a plasma of the processing gas by an inductive coupling in the processing chamber, the RF power having an appropriate frequency for RF discharge of the processing gas; a correction coil, provided at a position outside the processing chamber where the correction coil is to be coupled with the RF antenna by an electromagnetic induction, for controlling a plasma density distribution in the processing chamber; and an antenna-coil distance control unit for variably controlling a distance between the RF antenna and the correction coil while supporting the correction coil substantially in parallel with the RF antenna.

In the plasma processing apparatus of the first aspect, with the above configuration, especially the configuration having the correction coil and the antenna-coil distance control unit, it is possible to (stably obtain in a standardized manner the effect of the correction coil on the RF magnetic field generated around the antenna conductor by the RF current flowing in the RF antenna (the operational effect of locally decreasing the density of the core plasma generated around the position overlapped with the coil conductor by the inductive coupling) when the RF power is supplied from the RF power supply unit to the RF antenna, and also possible to control the effect of the correction coil (the effect of locally decreasing the density of the core plasma) approximately linearly. Accordingly, the plasma density distribution around the substrate on the substrate supporting unit can be arbitrarily and accurately controlled, and the uniformity of the plasma process can be easily improved.

In accordance with a second aspect of the present invention, there is provided a plasma processing apparatus. The apparatus includes: a processing chamber including a dielectric window at a ceiling portion thereof; a coil-shaped RF antenna, provided on the dielectric window; a substrate supporting unit, provided in the processing chamber, for mounting thereon a target substrate to be processed; a processing gas supply unit for supplying a desired processing gas to the processing chamber to perform a desired plasma process on the target substrate; an RF power supply unit for supplying an RF power to the RF antenna to generate a plasma from the processing gas by an inductive coupling in the processing chamber, the RF power having an appropriate frequency for RF discharge of the processing gas; a correction coil, provided at a position outside the processing chamber where the correction coil is to be coupled with the RF antenna by an electromagnetic induction, for controlling a plasma density distribution in the processing chamber; and a handling mechanism for performing a relative vertical movement, horizontal posture, inclined posture or periodical waving motion between the RF antenna and the correction coil In the plasma processing apparatus of the second aspect, with the above configuration, especially the configuration capable of performing a relatively vertical movement, horizontal posture, inclined posture or periodical waving motion between the RF antenna and the correction coil, the same effect of the plasma processing apparatus of the first aspect can be obtained. Further, it is possible to easily and accurately improve or arbitrarily control the effect of the correction coil (the effect of locally decreasing the core plasma density) or the uniformity of the azimuthal distribution of the plasma density near the substrate.

In accordance with a third aspect of the present invention, there is provided a plasma processing method for performing a desired plasma process on a substrate by using a plasma processing apparatus including a processing chamber including a dielectric window at a ceiling portion thereof; a coil-shaped RF antenna, provided on the dielectric window; a substrate supporting unit, provided in the processing chamber, for mounting thereon a target substrate to be processed; a processing gas supply unit for supplying a desired processing gas to the processing chamber to perform a desired plasma process on the target substrate; and an RF power supply unit for supplying an RF power to the RF antenna to generate a plasma of the processing gas by an inductive coupling in the processing chamber, the RF power having an appropriate frequency for RF discharge of the processing gas. The method includes: arranging a correction coil at a position outside the processing chamber in parallel with the RF antenna where the correction coil is to be coupled with the RF antenna by an electromagnetic induction; and controlling a plasma density distribution by variably controlling a distance between the RF antenna and the correction coil while maintaining the correction coil in parallel with the RF antenna.

In the plasma processing method of the present invention, with the above technique, especially, where the correction coil that can be coupled with the RF antenna by the electromagnetic induction is provided outside the processing chamber so as to be in parallel with the RF antenna; and the distance between the RF antenna and the correction coil is variably controlled while maintaining the correction coil in parallel with the RF antenna, it is possible to stably obtain in a standardized manner the effect of the correction coil on the RF magnetic field generated around the antenna conductor by the RF current flowing in the RF antenna when the RF power is supplied from the RF power supply unit to the RF antenna (the operational effect of locally decreasing the density of the plasma generated by the inductive coupling near the position overlapped with the coil conductor), and also possible to control the effect of the correction coil (the effect of locally decreasing the density of the plasma) approximately linearly. Accordingly, the plasma density distribution near the substrate on the substrate supporting unit can be arbitrarily and accurately controlled, and the uniformity of the plasma process can be easily improved.

BRIEF DESCRIPTION OF THE DRAWINGS

The other objects and features of the present invention will become apparent from the following description of embodiments, given in conjunction with the accompanying drawings, in which:

FIG. 21A provides a perspective showing postures of the correction coil in the respective phases in the periodic waving motion; and FIG. 21B provides a perspective view showing postures of the correction coil in the respective phases in the periodic waving motion.

DETAILED DESCRIPTION OF THE EMBODIMENT

The embodiments of the present invention will be described with reference to the accompanying drawings which form a part hereof.

First Embodiment

A first embodiment of the present invention will be described with reference to FIGS. 1 to 8.

Figure 1:
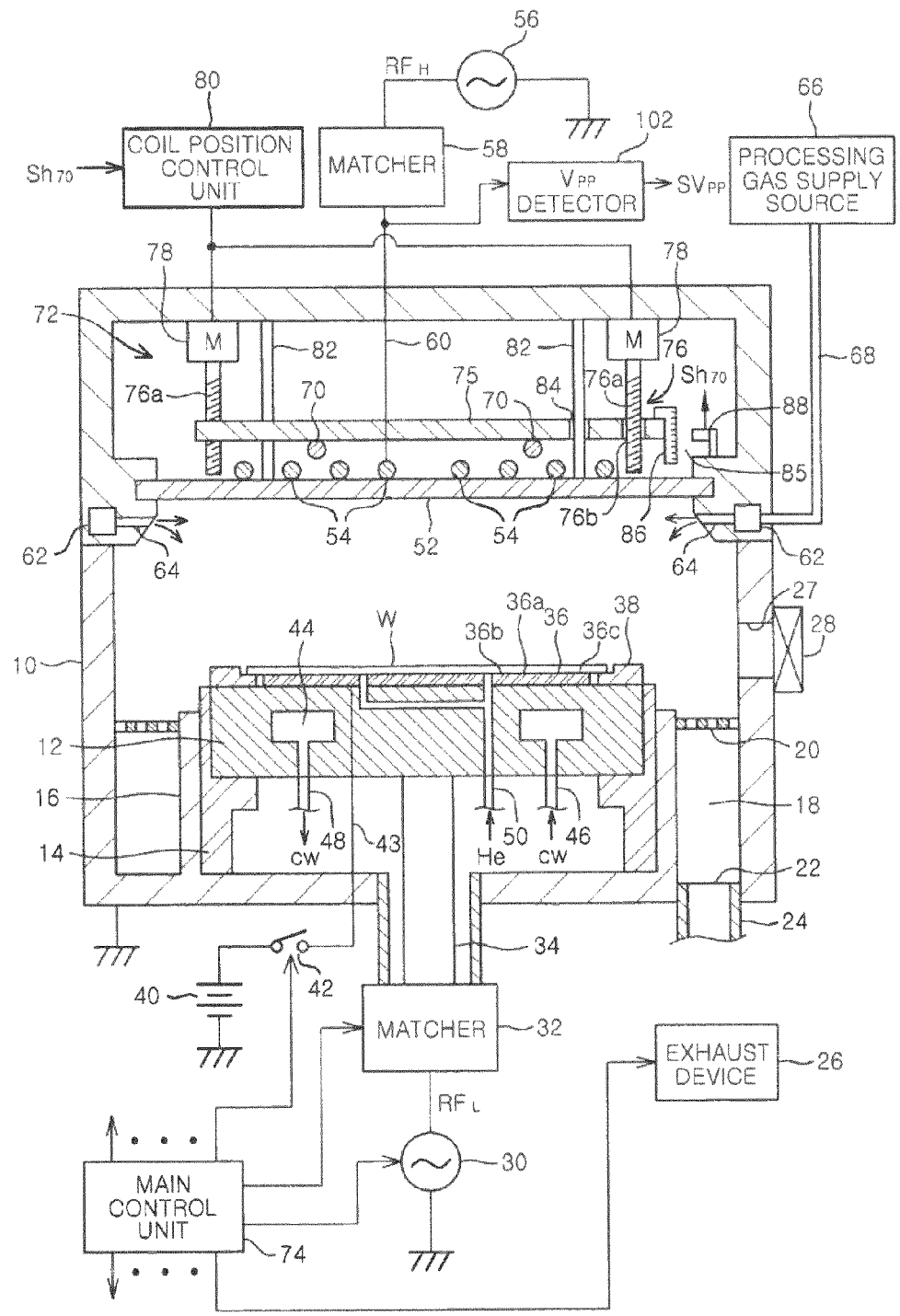
FIG. 1 is a longitudinal cross sectional view showing a configuration of an inductively coupled plasma etching apparatus in accordance with a first embodiment of the present invention.
Figure 2A:
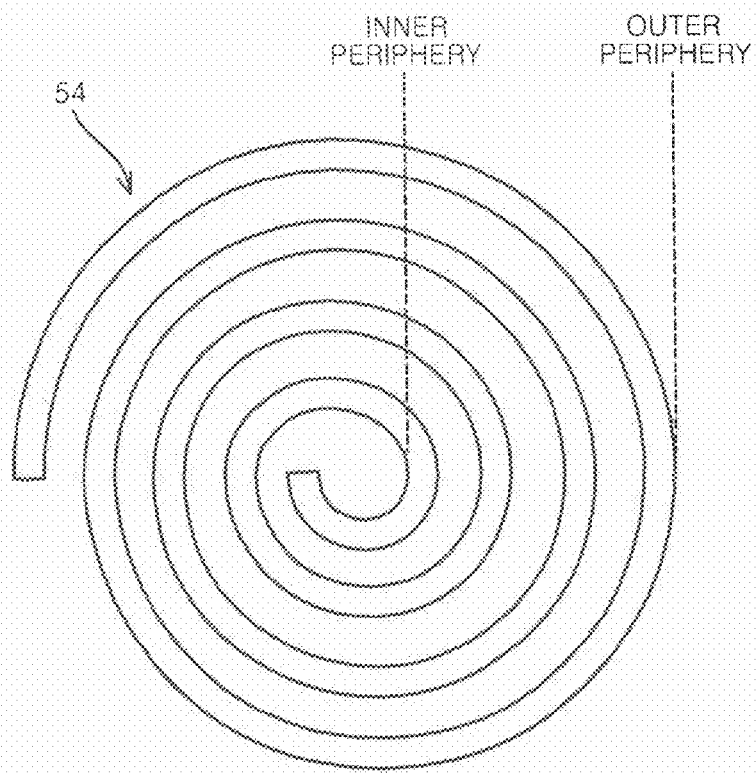
FIG. 2A provides a perspective view showing an example of a spiral coil-shaped RF antenna.
Figure 2B:
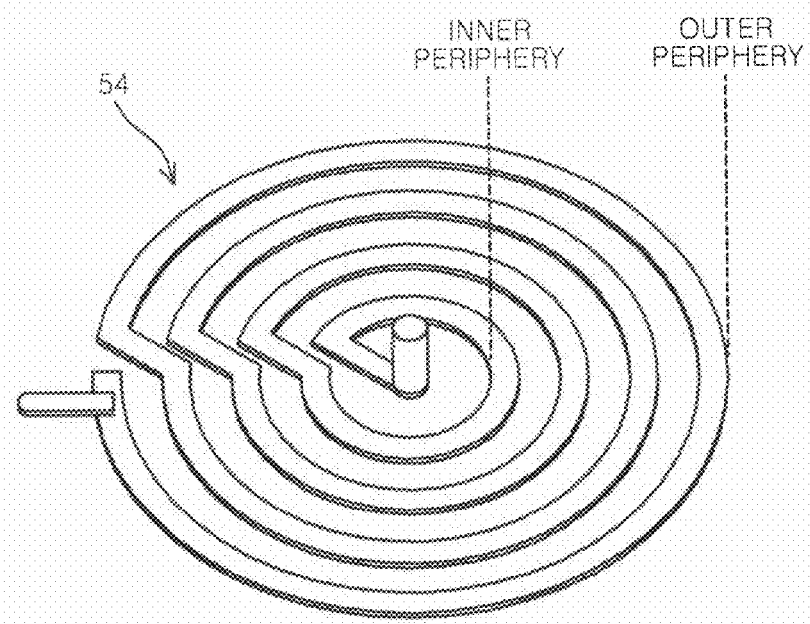
FIG. 2B provides a perspective view showing an example of a concentric coil-shaped RF antenna.

FIG. 1 shows a configuration of an inductively coupled plasma processing apparatus in accordance with the first embodiment of the present invention. The inductively coupled plasma processing apparatus is configured as a plasma etching apparatus using a planar coil type RF antenna, and includes a cylindrical vacuum chamber (processing chamber) 10 made of a metal, e.g., aluminum, stainless steel or the like. The chamber 10 is frame-grounded.

In the inductively coupled plasma etching apparatus, various units having no involvement in plasma generation will be described first.

At a lower central portion of the chamber 10, a circular plate-shaped susceptor 12 for mounting thereon a target substrate, e.g., a semiconductor wafer W as a substrate supporting table is horizontally arranged. The susceptor 12 also serves as an RF electrode. The susceptor 12, which is made of, e.g., aluminum, is supported by an insulating tubular support 14 uprightly extending from a bottom portion of the chamber 10.

A conductive tubular support part 16 is provided uprightly extending from the bottom portion of the chamber 10 along the periphery of the insulating tubular support 14, and an annular exhaust path 18 is defined between the support part 16 and an inner wall of the chamber 10. Moreover, an annular baffle plate 20 is attached to an entrance or a top portion of the exhaust path 18, and an exhaust port 22 is provided at a bottom portion thereof. To allow a gas to uniformly flow in the chamber 10 axisymmetrically with regard to the semiconductor wafer W on the susceptor 12, it is preferable to provide a plural number of exhaust ports 22 at a regular interval circumferentially.

The exhaust ports 22 are connected to an exhaust device 26 via respective exhaust pipes 24. The exhaust device 26 includes a vacuum pump such as a turbo molecular pump to evacuate a plasma-processing space in the chamber 10 to a predetermined vacuum level. Attached to the sidewall of the chamber 10 is a gate valve 28 for opening and closing a loading/unloading port 27.

An RF power supply 30 for an RF bias is electrically connected to the susceptor 12 via a matcher 32 and a power supply rod 34. The RF power supply 30 outputs a variable RF power $RF_L$ of an appropriate frequency (e.g., 13.56 MHz or less) to control the energy for attracting ions toward the semiconductor wafer W. The matcher 32 includes a variable-reactance matching circuit for performing the matching between the impedances of the RF power supply 30 and the load (mainly, susceptor, plasma and chamber), and the matching circuit includes a blocking capacitor for generating a self-bias.

An electrostatic chuck 36 is provided on an upper surface of the susceptor 12 to hold the semiconductor wafer W by an electrostatic attraction force, and a focus ring 38 is provided around the electrostatic chuck 36 to annularly surround the periphery of the semiconductor wafer W. The electrostatic chuck 36 includes an electrode 36a made of a conductive film and a pair of dielectric films 36b and 36c. A high voltage DC power supply 40 is electrically connected to the electrode 36a via a switch 42 by using a coated line 43. By applying a high DC voltage from the DC power supply 40 to the electrode 36a, the semiconductor wafer W can be attracted to and held on the electrostatic chuck 36 by the electrostatic force.

An annular coolant channel or coolant path 44, which extends in, e.g., a circumferential direction, is provided inside the susceptor 12. A coolant, e.g., a cooling water, of a predetermined temperature is supplied from a chiller unit (not shown) to the coolant path 44 to be circulated through pipelines 46 and 48. By adjusting the temperature of the coolant, it is possible to control a process temperature of the semiconductor wafer W held on the electrostatic chuck 36. Moreover, a heat transfer gas, e.g., He gas, is supplied from a heat transfer gas supply unit (not shown) to a space between a top surface of the electrostatic chuck 36 and a bottom surface of the semiconductor wafer W through a gas supply line 50. Further, an elevating mechanism (not shown) including lift pins capable of being moved up and down while vertically extending through the susceptor 12 and the like is provided to load and unload the semiconductor wafer W.

Next, various units having involvement in the plasma generation in the inductively coupled plasma etching apparatus will be described.

A ceiling of the chamber 10 is separated from the susceptor 12 at a relatively large distance, and a circular dielectric window 52 formed of, e.g., a quartz plate is airtightly provided in the ceiling. In general, a coil-shaped RF antenna 54 is horizontally provided on the dielectric window 52 so as to be concentric with the chamber 10 or the susceptor 12. The RF antenna 54 preferably has, e.g., a spiral coil shape (see FIG. 2A) or a shape of one or more concentric coils, each circular cycle having a same radius (see FIG. 2B), and is fixed onto the dielectric window 52 by an antenna fixing member (not shown) made of an insulating material.

One end of the RF antenna 54 is electrically connected to an output terminal of the RF power supply 56 for plasma generation via a matcher 58 and a power supply line 60. Although it is not illustrated, the other end of the RF antenna 54 is electrically connected to a ground potential through a ground line.

The RF power supply 56 outputs an RF power $RF_H$ of an appropriate frequency (e.g., 13.56 MHz or more) for plasma generation by RF discharge at a desired level. The matcher includes a variable-reactance matching circuit for performing the matching between the impedances of the RF power supply 56 and the load (mainly, RF antenna, plasma and correction coil).

A processing gas supply unit for supplying a processing gas to the chamber 10 includes an annular manifold or buffer unit 62 provided inside (or outside) the sidewall of the chamber 10 to be located at a place slightly lower than the dielectric window 52; a plurality of sidewall gas injection holes 64 circumferentially formed on the sidewall at a regular interval and opened to the plasma-generation space from the buffer unit 62; and a gas supply line 68 extended from the processing gas supply source 66 to the buffer unit 62. The processing gas supply source 66 includes a mass flow controller and an on-off valve, which are not shown.

In order to variably control a density distribution of the inductively coupled plasma generated in the processing space in the chamber 10 in the diametric direction, the inductively coupled plasma etching apparatus includes, in an antenna chamber serving as the atmospheric space provided above a ceiling plate of the chamber 10, i.e., the dielectric window 52, a correction coil 70 that can be coupled with the RF antenna 54 by an electromagnetic induction and an antenna-coil distance control unit 72 for variably controlling a distance between the RF antenna 54 and the correction coil 70 while maintaining the correction coil 70 in parallel with (i.e., horizontally with respect to) the RF antenna 54. The configurations and operations of the correction coil 70 and the antenna-coil distance control unit 72 will be described in detail later.

A main control unit 74 includes, e.g., a microcomputer and controls the overall operation (sequence) of the plasma etching apparatus and individual operations of various units, e.g., the exhaust device 26, the RF power supplies 30 and 56, the matchers 32 and 58, the switch 42 of the electrostatic chuck, the processing gas supply source 66, the antenna-coil distance control unit 72, the chiller unit (not shown), the heat-transfer gas supply unit (not shown) and the like.

When the inductively coupled plasma etching apparatus performs an etching process, the gate valve 28 is first opened to load a target substrate, i.e., a semiconductor wafer W, into the chamber 10 and mount it onto the electrostatic chuck 36. Then, the gate valve 28 is closed, and an etching gas (typically, a gaseous mixture) is introduced from the processing gas supply source 66, via the buffer unit 62, into the chamber 10 at a preset flow rate and flow rate ratio through the sidewall gas injection holes 64 by using the gas supply line 68. Thereafter, the RF power supply unit 56 is turned on to output a plasma-generating RF power $RF_H$ at a predetermined RF level, so that a current of the RF power $RF_H$ is supplied to the RF antenna 54 through the RF power supply line 60 via the matcher 58. In addition, the RF power supply 30 is turned on to output an ion-attracting control RF power $RF_L$ at a predetermined RF level, so that the RF power $RF_L$ is supplied to the susceptor through the power supply rod 34 via the matcher 32. Further, a heat-transfer gas (i.e., He gas) is supplied from the heat-transfer gas supply unit to a contact interface between the electrostatic chuck 36 and the semiconductor wafer W, and the switch is turned on, so that the heat-transfer gas is confined in the contact interface by the electrostatic attraction force of the electrostatic chuck 36.

The etching gas injected through the sidewall gas injection holes 64 is uniformly diffused in the processing space below the dielectric window 52. At this time, the RF magnetic field is generated around the RF antenna 54 by the current of the RF power $RF_H$ flowing through the RF antenna 54, so that magnetic force lines travel through the dielectric window 52 and across the plasma generation space in the chamber and, thus, an RF electric field is induced in the azimuthal direction of the processing space by the temporal alteration of the RF magnetic field.

Then, electrons azimuthally accelerated by the induced electric field collide with molecules and/or atoms in the etching gas, to thereby ionize the etching gas and generate a plasma in a doughnut shape. In the wide processing space, radicals and ions of the plasma generated in the doughnut shape are diffused in all directions, so that the radicals isotropically pour down and the ions are attracted by the DC bias onto a top surface (target surface) of the semiconductor wafer W. Accordingly, plasma active species cause chemical and physical reactions on the target surface of the semiconductor wafer W, thereby etching a target film into a predetermined pattern.

As such, in the plasma etching apparatus, an inductively coupled plasma is generated in the doughnut shape below the dielectric window 52 around the RF antenna 54 and then diffused in the large processing space, so that the density of the plasma becomes uniform around the susceptor 12 (i.e., on the semiconductor wafer W). Here, the density of the doughnut-shaped plasma depends on the intensity of the induced electric field and, furthermore, the magnitude of the RF power $RF_H$ supplied to the RF antenna (more specifically, the current flowing in the RF antenna 54). In other words, as the RF power $RF_H$ is increased, the density of the doughnut-shaped plasma is increased and, thus, the plasma density around the susceptor 12 is generally increased.

Meanwhile, the shape in which the plasma in the doughnut shape is diffused in all directions (especially, in the diametric direction) mainly depends on the pressure inside the chamber 10 and, thus, as the pressure becomes decreased, amounts of the plasma are accumulated on a central portion of chamber 10 become increased so that, the density distribution of the plasma around the susceptor 12 tends to be swollen at the central portion. Further, the density distribution of the plasma in the doughnut shape may be changed depending on the magnitude of the RF power $RF_H$ supplied to the RF antenna 54, the flow rate of the processing gas introduced into the chamber 10, or the like.

Here, the expression "plasma in a doughnut shape" indicates not only a state where the plasma is generated only at the radially outer portion in the chamber 10 without being generated at the radially inner portion (at the central portion) therein but also a state where the volume or density of the plasma generated at the radially outer portion becomes larger than that at the radially inner portion. Moreover, if the kind of the processing gas, the pressure inside the chamber 10 and/or the like are changed, the plasma may be generated in another shape instead of the doughnut shape.

In such inductively coupled plasma etching apparatus, the uniformity of the plasma density around the susceptor 12 is improved in the radial distribution, and the electromagnetic correction to the RF magnetic field generated by the RF antenna 54 is performed by the correction coil 70. Further, the vertical position of the correction coil 70 is varied by the antenna-coil distance control unit 72 depending on the process conditions (pressure inside the chamber 10 and the like).

Hereinafter, the configurations and operations of the correction coil 70 and the antenna-coil distance control unit 72 as major features of the plasma etching apparatus will be described.

The correction coil 70 is formed of a circular ring-shaped single- or multi-wound coil having closed ends, and is arranged to be concentric with the RF antenna 54. Further, the correction coil 70 has a diameter such that its coil conductor is diametrically positioned between the inner periphery and the outer periphery of the RF antenna 54 (preferably, around the middle portion therebetween). The correction coil 70 is preferably made of, e.g., a copper-based material having a high conductivity.

In the present embodiment, the expression "concentric" indicates a positional relationship in which central axial lines of a plurality of coils or antennas are overlapped with each other, including not only a case where coil surfaces or antenna surfaces are axially or vertically offset to each other but also a case where the coil surfaces or the antenna coil surfaces are identical to each other on the same plane (concentric positional relationship).

The antenna-coil distance control unit 72 includes: a horizontal insulating support plate 75 for supporting the correction coil 70; stepping motors 78, operationally coupled to the horizontal support plate 75 by using ball screws 76, for varying the vertical position of the correction coil 70 by rotating feed screws 76a of the ball screws 76; a coil position control unit 80 for variably controlling the vertical position of the correction coil 70 by using the stepping motors 78 and the ball screws 76; and guide rods 82 for guiding the vertical movement of the horizontal support plate 75 while supporting the horizontal support plate 75 horizontally.

Specifically, the correction coil 70 is horizontally attached to the horizontal support plate 75 by an insulating coil fixing member (not shown). The horizontal support plate 75 has nut portions 76b to be screwed on the respective feed screws 76a and through holes 84 through which guide rods 82 pass respectively slidably. The feed screws 76a of the ball screws 76 extend respectively vertically so as to be coupled with rotation shafts of the stepping motors 78 directly or via speed reduction mechanisms (not shown).

When the feed screws 76a are rotated by driving the stepping motors 78, the horizontal support plate 75 where the nut portions 76b are formed is moved up and down along the feed screws 76a of the ball screws 76, and the correction coil 70 is moved vertically as a single unit with the horizontal support plate 75 while maintaining the horizontal posture thereof. The coil position control unit 80 receives a signal indicating the vertical position (target value or setting value) of the correction coil 70 from the main control unit 74 and controls the vertical position of the correction coil 70 to the target value by controlling the rotation direction and the rotation amount of the stepping motors 78 and the elevation amount of the horizontal support plate 75.

In such configuration shown in FIG. 1, a plurality of ball screws 76 operationally coupled to the horizontal support plate 75 at a plurality of locations are independently driven by a plurality of stepping motors 78. However, in another configuration, a plurality of ball screws 76 can be driven at the same time by a single stepping motor 78 by using a pulley or a belt mechanism.

In the present embodiment, the inductively coupled plasma etching apparatus further includes a linear scale 85 for measuring the vertical position of the correction coil and feeding a measured value $Sh_{70}$ back to the coil position control unit 80. The linear scale 85 includes a vertically extending scale portion 86 attached to the horizontal support plate 75; and a scale reading portion 88, attached to a main body or an extended portion of the chamber 10, to optically read out the scale on the scale portion 86. The coil position control unit 80 can control the target vertical position of the correction coil 70 to the measured value $Sh_{70}$ obtained by the linear scale.

With the above configuration, the antenna-coil distance control unit 72 can arbitrarily and accurately vary the vertical position of the correction coil 70 relative to the RF antenna 54 within a predetermined range (e.g., about 1 mm to 50 mm) while maintaining the correction coil 70 in parallel with (horizontally with regard to) the horizontally arranged RF antenna 54. Preferably, the upper limit of the vertical position of the correction coil 70 may be set to a position separated from the RF antenna 54 by a large distance such that the RF magnetic field generated by the RF antenna 54 is not substantially affected by the correction coil 70, or a position set as if the correction coil 70 is not provided. Further, the lower limit of the vertical position of the correction coil 70 may be set close to the RF antenna 54 without being in contact with the RF antenna so as to maximize the effect on the RF magnetic field generated by the RF antenna 54.

Next, a basic operation of the correction coil 70 will be described.

Figure 3A:
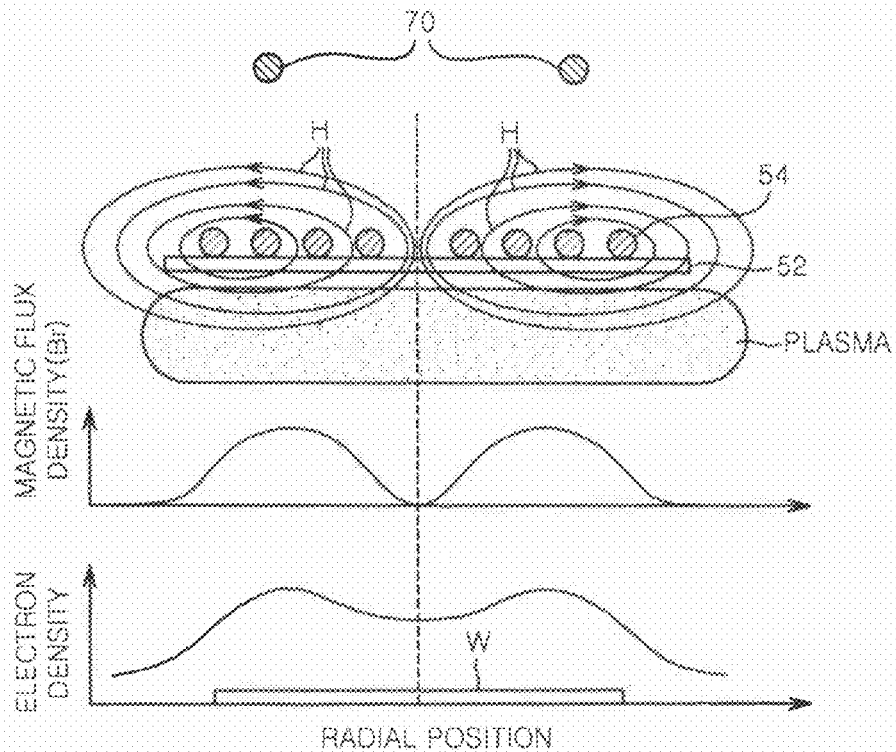
FIG. 3A schematically shows an example of an effect of an electromagnetic field when a correction coil is arranged away from an RF antenna.

As shown in FIG. 3A, when the vertical position of the correction coil 70 is set near the upper limit, an RF magnetic field H generated around the antenna conductor by the current of the RF power $RF_H$ flowing in the RF antenna 54 produces loop-shaped magnetic force lines which radially travel through the processing space provided below the dielectric window 52 without being affected by the correction coil 70.

The radial (horizontal) component Br of the magnetic flux density in the processing space is constantly zero at the central and the peripheral portion of the chamber 10 regardless of the magnitude of the current of the RF power $RF_H$, and has a local maximum value at a position overlapped with the middle portion (hereinafter, referred to as "antenna middle portion") between the inner periphery and the outer periphery of the RF antenna 54. As the current of the RF power $RF_H$ is increased, the local maximum value is increased. The intensity distribution of the induced electric field generated in the azimuthal direction by the RF magnetic field RF shows the same profile as that of the radial distribution of the magnetic flux density Br. Accordingly, the plasma is generated in a doughnut shape near the dielectric window 52 so as to be concentric with the RF antenna 54.

The doughnut-shaped plasma is diffused in all directions (especially, in the radial direction) in the processing space. As described above, the diffusion shape thereof depends on the pressure inside the chamber 10. For example, as shown in FIG. 3A, the radial electron density (plasma density) around the susceptor 12 may show a profile in which it has a relatively high value (local maximum value) at a portion corresponding to the antenna middle portion and is significantly decreased around the central and the peripheral portion.

Figure 3B:
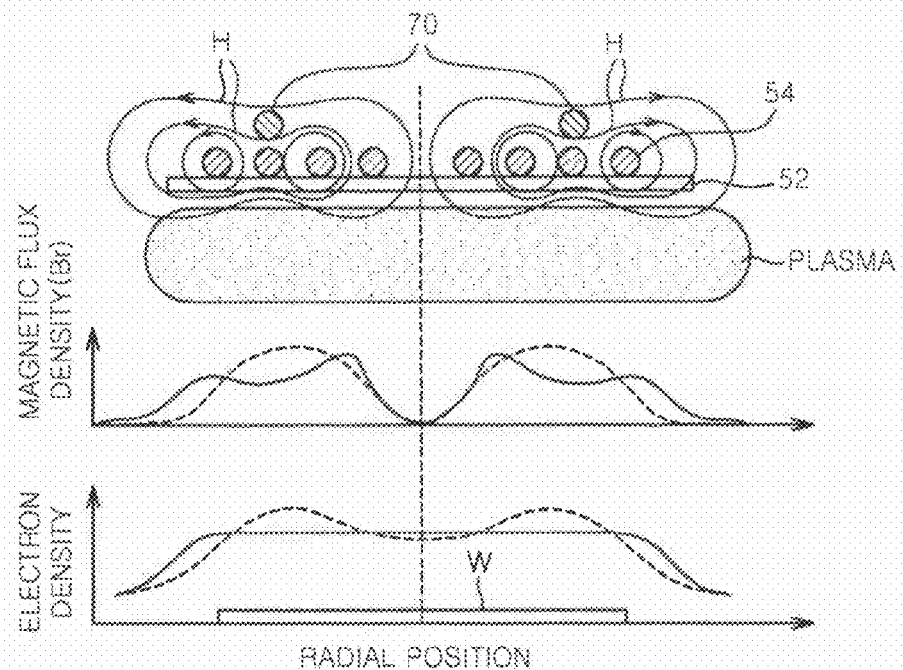
FIG. 3B schematically shows an example of an effect of an electromagnetic field when the correction coil is arranged close to the RF antenna.

In this case, as shown in FIG. 3B, if the vertical position of the correction coil 70 is lowered to, e.g., near the lower limit, the RF magnetic field H generated around the antenna conductor by the current of the RF power $RF_H$ which flows in the RF antenna 54 is affected by the reaction of the electromagnetic induction due to the presence of the correction coil 70. The reaction of the electromagnetic induction indicates an action against the alteration of the magnetic force lines (magnetic flux) traveling through the loop of the correction coil 70. An electromotive force is induced by the alteration of the magnetic force lines, thereby allowing a current to flow in the loop of the correction coil 70.

Due to the reaction of the electromagnetic induction from the correction coil 70, the radial (horizontal) component Br of the magnetic flux density in the processing space close to the dielectric window 52 becomes weak locally at the portion immediately below the coil conductor of the correction coil 70 (especially, the antenna middle portion). Accordingly, the intensity of the induced electric field generated in the azimuthal direction also becomes weak locally at the portion corresponding to the antenna middle portion. Resultantly, the uniformity of the radial electron density (plasma density) around the susceptor 12 is improved.

Figure 4A:
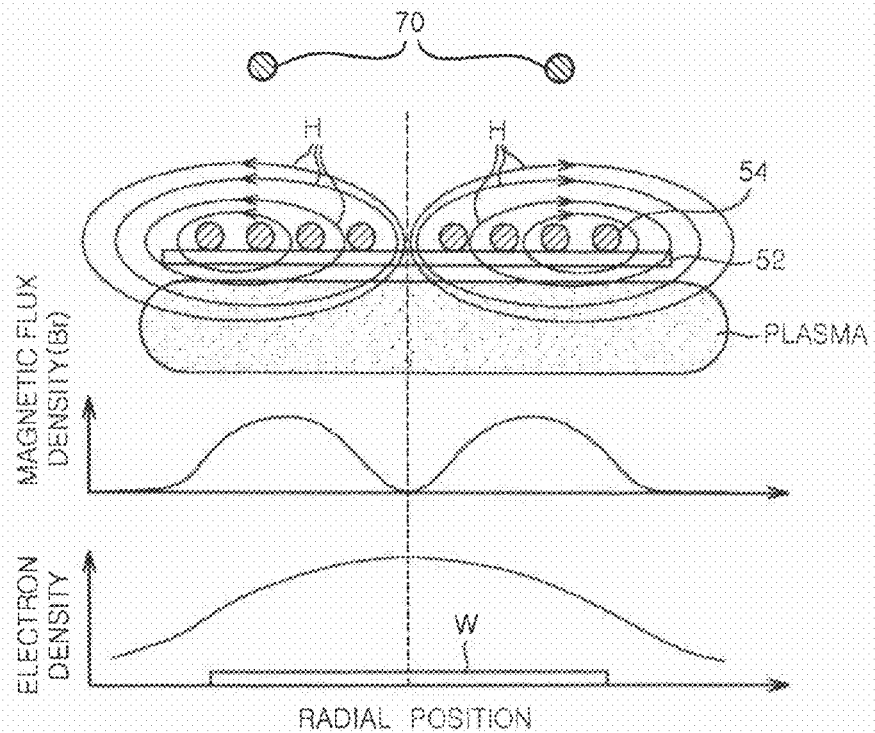
FIG. 4A schematically shows another example of the effect of an electromagnetic field when the correction coil is arranged away from the RF antenna.

The diffusion shape of the plasma shown in FIG. 3A is merely an example. For example, when the pressure is low, the plasma is excessively accumulated at the central portion of the chamber 10, so that the electron density (plasma density) around the susceptor 12 shows a mountain-shaped profile in which it has a relatively local maximum value at the central portion, as shown in FIG. 4A.

Figure 4B:
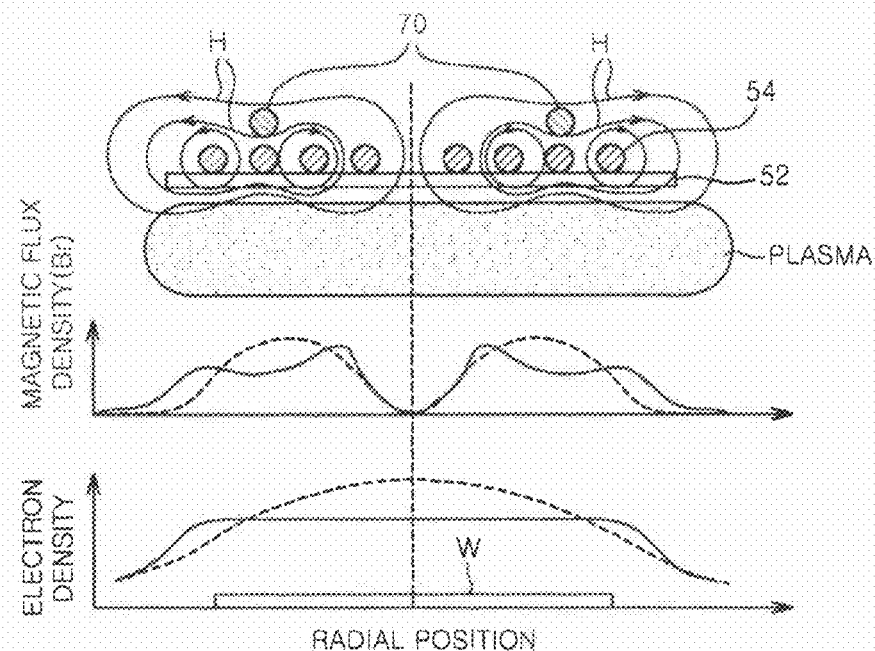
FIG. 4B schematically shows another example of the effect of an electromagnetic field when the correction coil is arranged close to the RF antenna.

In this case, as shown in FIG. 4B, if the correction coil 70 is lowered to, e.g., near the lower limit, the radial (horizontal) component Br of the magnetic flux density in the processing space close to the dielectric window 52 becomes weak locally at the middle portion overlapped with the coil conductor of the correction coil 70. Accordingly, the accumulation of the plasma becomes weak at the central portion of the chamber, and the uniformity of the plasma density is improved in the diametric direction around the susceptor 12.

The present inventors have verified the above-described effect due to the correction coil 70 through the following electromagnetic system simulations. Specifically, the vertical positions (distance) of the correction coil 70 relative to the RF antenna 54 were set to be, e.g., 5, 10 and 20 mm and infinite (no correction coil) as parameters, and the distribution of the current density (corresponding to the plasma density distribution) in the radial direction was obtained at a portion (separated from the top surface by about 5 mm) in the doughnut-shaped plasma. As a result, the verification result shown in FIG. 5 was obtained.

In the electromagnetic system simulations, the outer radius of the RF antenna 54 was set to be, e.g., 250 mm; and the inner radius and the outer radius of the correction coil 70 were respectively set to be, e.g., 100 mm and 130 mm. As the plasma generated in the doughnut shape in the processing space below the RF antenna 54 by the inductive coupling, a disk-shaped resistance was simulated, where its radius, resistivity and skin depth were set to be, e.g., 500 mm, 100 Ωcm and 10 mm, respectively. The plasma-generating RF power $RF_H$ had a frequency of about 13.56 MHz.

Figure 5:
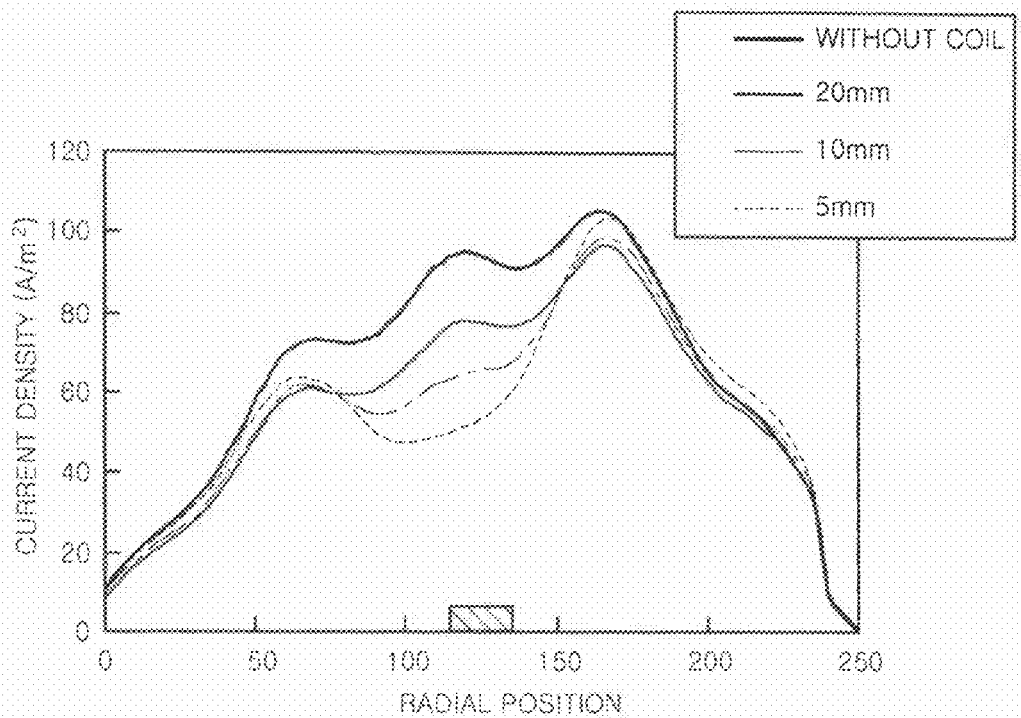
FIG. 5 illustrates changes in the current density distribution in a processing space around a dielectric window in the case of changing a distance between the correction coil and the RF antenna.

FIG. 5 shows that, when the correction coil 70 is arranged at the vertical position such that the correction coil 70 is coupled with the RF antenna 54 by an electromagnetic induction, the plasma density in the doughnut-shaped plasma is locally decreased around the position overlapped with the coil conductor of the correction coil 70 (position overlapped with the antenna middle portion in FIG. 5) and such local decrease in the plasma density becomes larger approximately linearly as the correction coil 70 becomes closer to the RF antenna 54.

In the present embodiment, as described above, the correction coil 70 is arranged to be concentric with the RF antenna 54, and a coil conductor of the correction coil 70 is positioned between the inner periphery and the outer periphery of the RF antenna 54 (preferably, while corresponding to the antenna middle portion). Further, the antenna-coil distance control unit 72 can arbitrarily and accurately vary the vertical position of the correction coil relative to the RF antenna 54 within a predetermined range (e.g., 1 mm to 50 mm) while maintaining the correction coil 70 in parallel with the horizontal RF antenna 54. Therefore, the characteristics shown in FIG. 5 which have been verified by the electromagnetic field simulations can be achieved in the inductively coupled plasma etching apparatus, and the degree of freedom and the accuracy in controlling the plasma density distribution can be improved considerably.

The inductively coupled plasma etching apparatus of the present embodiment may be preferably applied to, e.g., the application for continuously etching a multilayered film on the surface of a target substrate at a plurality of steps. Hereinafter, a multilayer resist method shown in FIGS. 6A to 6D in accordance with another embodiment of the present invention will be described.

As shown in FIGS. 6A to 6D, in a main surface of the semiconductor wafer W serving as a target substrate to be processed, an SiN layer 132 serving as a lowermost layer (final mask) is formed on an original target film 130 (e.g., a gate Si film) to be processed. An organic film (e.g., carbon film) 134 serving as an intermediate layer is formed on the SiN layer 132. A photoresist 138 serving as an uppermost layer is formed on the organic film 134 via a Si-containing bottom anti-reflective coating (BARC) film 136. The SiN layer 132, the organic film 134 and the BARC film 136 are formed by using the chemical vapor deposition (CVD) or the spin-on coating method. The photoresist 138 is patterned by the photolithography.

Figure 6A:
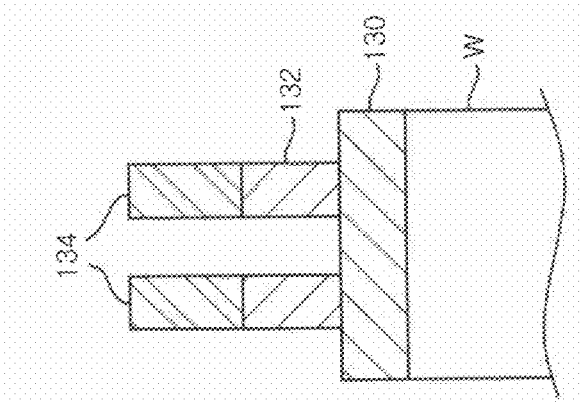
FIGS. 6A to 6D stepwisely show a process of a multilayer resist method.

First, in a first etching process step, as shown in FIG. 6A, the Si-containing BARC film 136 is etched by using the patterned photoresist 138 as a mask. In this case, a gaseous mixture of $CF_4$ and $O_2$ is employed as an etching gas, and the pressure inside the chamber 10 is set to be relatively low, e.g., 10 mTorr.

Figure 6B:
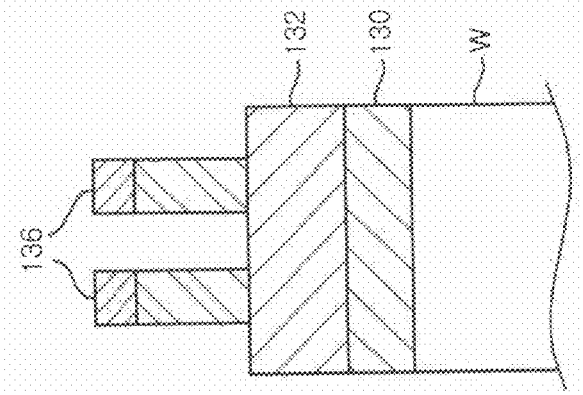

Next, in a second etching process step, as shown in FIG. 6B, the organic film 134 is etched by using as a mask the photoresist 138 and the BARC film 136. In this case, a single $O_2$ gas is employed as an etching gas, and the pressure inside the chamber 10 is set to be relatively lower, e.g., 5 mTorr.

Figure 6C:
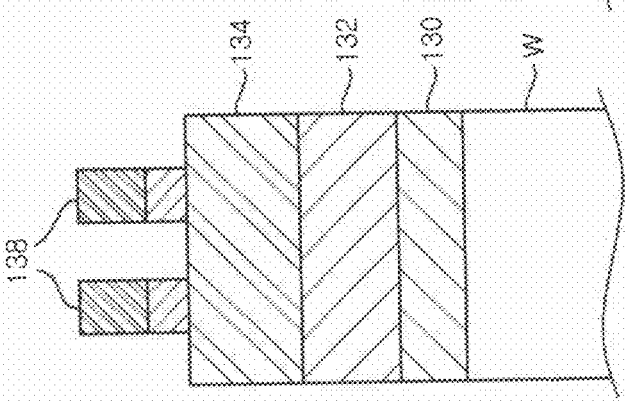
Figure 6D:
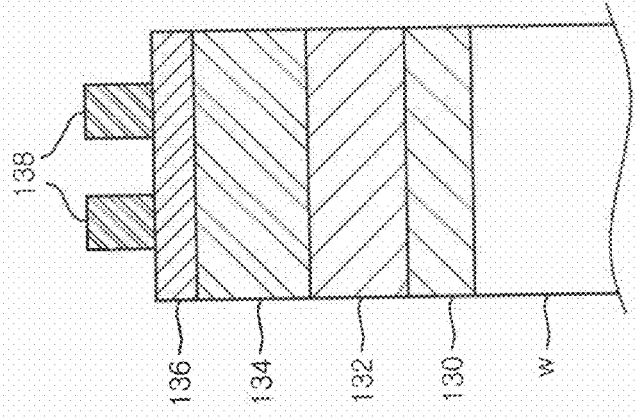

Finally, in a third etching process step, as shown in FIGS. 6C and 6D, the SiN layer 132 is etched by using as a mask the patterned BARC 136 and the organic film 134. In this case, a gaseous mixture of $CHF_3$, $CF_4$, Ar and $O_2$ is employed as an etching gas, and the pressure inside the chamber 10 is set to be relatively high, e.g., 50 mTorr.

In such multiple etching process steps, the process conditions are entirely or partially (especially, the pressure in the chamber 10) changed and, thus, the plasma generated in the doughnut shape is diffused in another form in the processing space. Here, in case that the correction coil 70 is not operated (electrically connected), the electron density (plasma density) around the susceptor 12 in the first and the second step (pressure of 10 mTorr or less) show a precipitous mountain-shaped profile in which it has a relatively significantly high value at the central portion, as illustrated in FIG. 4A. The electron density in the third step (pressure of 50 mTorr) has a gentle mountain-shaped profile in which it has a slightly high value at the central portion.

In accordance with the present embodiment, in, e.g., a process recipe, the vertical position of the correction coil is set as one of the process parameters or recipe information as a specification that is added into or related to typical process conditions (such as magnitude of the RF power, pressure, gas type, gas flow rate and the like). Then, when the multiple etching process steps are performed, the main control unit 74 reads out data corresponding to the vertical position of the correction coil 70 from a memory and, at each step, sets the vertical position of the correction coil 70 to a setting (target) value.

Figure 7:
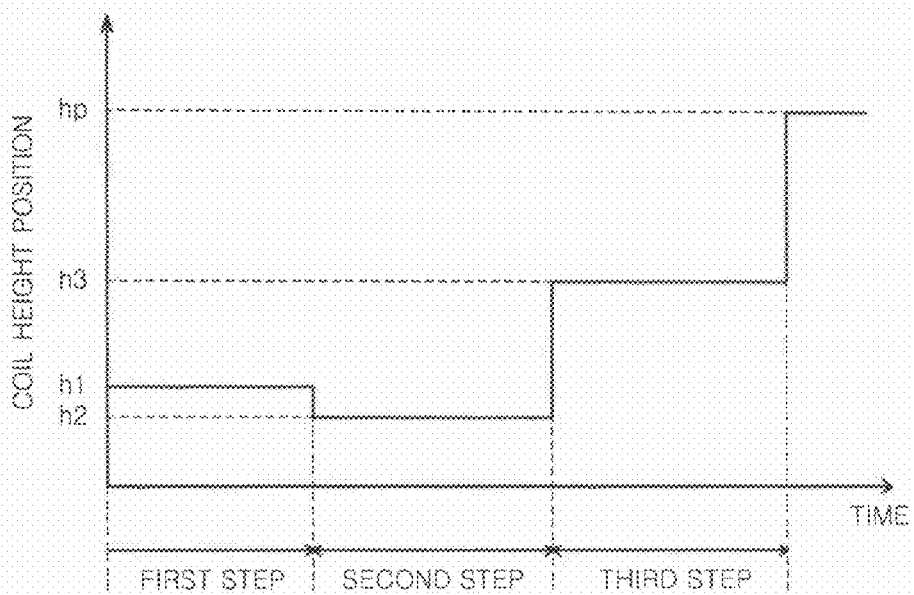
FIG. 7 explains a method for variably controlling a vertical position of the correction coil in multiple etching process steps of the multilayer resist method.

Thus, in the etching process steps of the multilayer resist method (see FIGS. 6A to 6D), at each step of the first step (10 mTorr), the second step (5 mTorr) and the third step (50 mTorr), the vertical position of the correction coil 70 are respectively converted, into a relatively low preset position $h_1$, a lower position $h_2$, and a relatively high position $h_3$, as shown in FIG. 7.

As such, it is possible to variably control the vertical position of the correction coil 70 depending on the adjustment, the conversion and the change of the process conditions during a single plasma process or a series of multiple plasma processes of one semiconductor wafer W. Accordingly, through the entire processing time or the entire steps of the single-wafer plasma process, it is possible to arbitrarily, accurately and linearly control the operation (reaction in the electromagnetic system) of the correction coil 70 with regard to the RF magnetic field H generated around the antenna conductor by the current of the RF power $RF_H$ which flows in the RF antenna 54, i.e., the degree (strength and weakness) of the effect of locally decreasing the plasma density in the doughnut-shaped plasma around the position overlapped with the coil conductor of the correction coil 70. Hence, the uniformity of the radial plasma density around the susceptor 12 can be maintained and, thus, the uniformity of the plasma process can be improved.

In the multi-step method, while the etching process is not performed, the vertical position of the correction coil 70 may be returned to a home position $h_P$ close to the upper limit which is substantially the same as the case where the correction coil 70 is not provided, as illustrated in FIG. 7.

Figure 8:
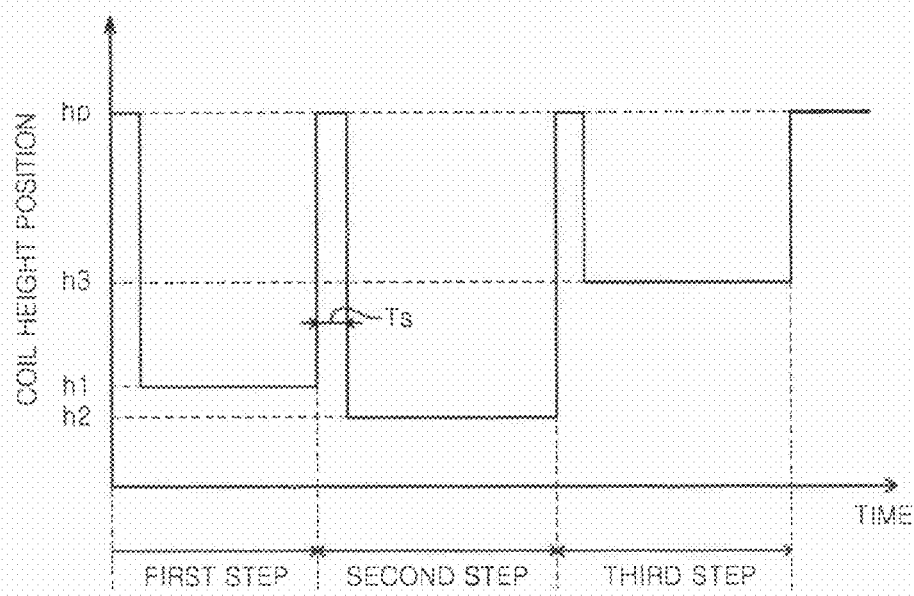
FIG. 8 explains a method for variably controlling the vertical position of the correction coil in consideration of plasma ignitability.

When the process of each step is initiated, i.e., when the current of the RF power $RF_H$ starts to flow in the RF antenna 54, a large induced current flows in the correction coil 70 and, thus, it is difficult to supply the power to the plasma, which may hinder the ignition of the plasma. For that reason, as shown in FIG. 8, when the process of each step is initiated, the correction coil 70 may be retreated to the home position $H_P$ so that the plasma can be stably ignited. Then, after the plasma is ignited (e.g., after a predetermined period of time $T_S$ elapses from the initiation of the process), the correction coil 70 may be vertically moved to a preset vertical position $h_n$ (n=1, 2, 3).

In accordance with the present embodiment, before the plasma process is initiated, the correction coil 70 is separated from the RF antenna 54 at a large distance and, after a predetermined period of time elapses from the ignition of the plasma in the chamber 10, the correction coil 70 (and/or the RF antenna 54) is vertically moved so as to be close thereto, thereby controlling the distance to a preset value.

In the present embodiment, as described above, the antenna-coil distance control unit 72 for variably controlling a separated distance or a vertical position of the correction coil 70 relative to the RF antenna 54 is provided with a ball screw mechanism. However, instead of the ball screw mechanism, it is also possible to use, e.g., a 3D cam mechanism such as a rotary cam, an end cam or the like. Although the detailed configuration is not shown, the antenna-coil distance control unit 72 of an additional embodiment may include: an insulating coil supporting body for maintaining the correction coil 70 in parallel with the RF antenna 54; a motor, coupled with the coil supporting body via a 3D cam mechanism having a rotating body, for varying a vertical position of the correction coil 70 by rotating the rotating body of the 3D cam mechanism; and a coil vertical position control unit for adjusting the vertical position of the correction coil 70 by controlling the rotation direction and the rotation amount of the motor.

Alternatively, as for the antenna-coil distance control unit 72 for variably controlling the vertical position of the correction coil 70, it is possible to use an elevation mechanism having a non-rotary elevation shaft such as a rack and pinion, a piston or the like. Further, as for a driving source of the elevation mechanism, it is possible to use, e.g., an air cylinder, instead of a motor. When a motor is used as a driving source, an AC motor, a DC motor, a linear motor or the like may be used instead of a stepping motor.

As for a device for measuring or feeding back an arbitrary vertical position of the correction coil 70, it is possible to use, e.g., an encoder, instead of the linear scale 85 of the above-described embodiment. Moreover, when the vertical position is determined to a predetermined position by moving the correction coil 70, it is preferable to use a position sensor such as a photo sensor, a limit switch or the like.

Second Embodiment

Hereinafter, a second embodiment of the present invention will be described with reference to FIGS. 9 to 14.

In a plasma etching apparatus of the second embodiment, the uniformity of the radial distribution of the plasma density around the susceptor 12 can be improved; the electromagnetic correction of the RF magnetic field generated by the RF antenna 54 can be performed by the correction coil 90; and the vertical position of a correction coil 90 having a capacitor can be variably controlled by the antenna-coil distance control unit 72.

Hereinafter, the configuration and the operation of the correction coil 90 having a capacitor as a major feature of the inductively coupled plasma etching apparatus will be described.

Figure 9:
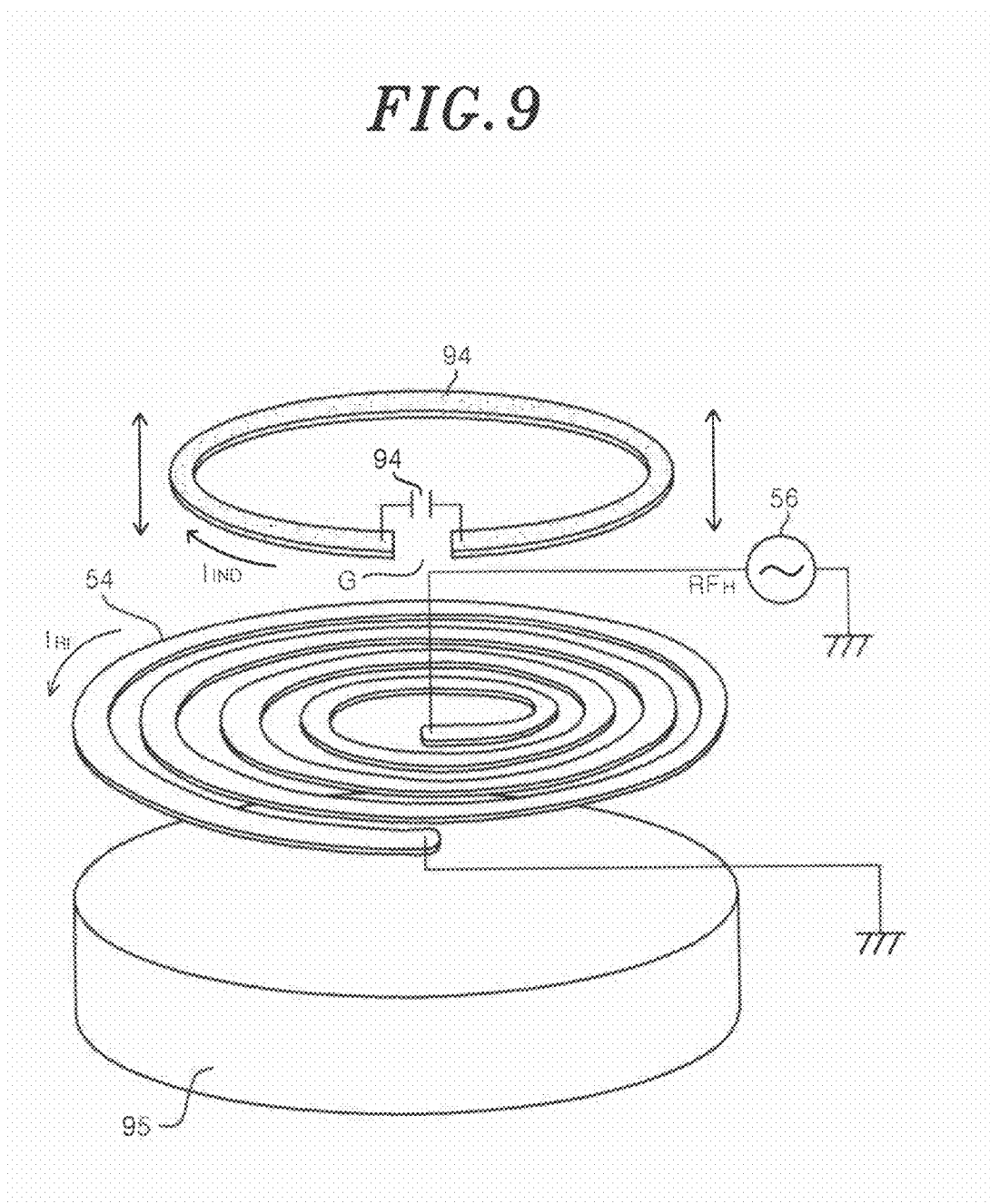
FIG. 9 provides a perspective view schematically showing a configuration of a correction coil having a fixed capacitor and an arrangement relationship thereof relative to the RF antenna in accordance with a second embodiment of the present invention.

As shown in FIG. 9, the correction coil 90 is formed of a single- or a multi-wound coil having both open ends with a cutout portion (gap) G therebetween, and a fixed capacitor 94 is provided at the cutout portion G. The fixed capacitor 94, as will be described later, may be of, e.g., a commercially available general-purpose type such as a film capacitor or a ceramic capacitor, or may be a special customized product or a typical product which is assembled as one single unit with the correction coil 90.

Preferably, the correction coil 90 is arranged to be concentric with the RF antenna 54, and has a diameter such that its coil conductor is positioned between the inner periphery and the outer periphery of the RF antenna 54 (e.g., the middle portion). As shown in FIG. 9, the correction coil 90 is azimuthally arranged such that the position of the fixed capacitor 94 (i.e., the cutout portion G) is overlapped with that of the RF input-output portion of the RF antenna 54. The coil conductor of the correction coil 90 is preferably made of, a metal having a high conductivity, e.g., silver-plated copper.

Hereinafter, the operation of the correction coil 90 having the fixed capacitor 94 will be described. Following electromagnetic field simulations were performed by the present inventors for the inductively coupled plasma etching apparatus of the present embodiment.

Specifically, the vertical positions (distance) of the correction coil 70 relative to the RF antenna 54 were set to be, e.g., 5, 10 and 20 mm and infinite (no correction coil) as parameters, and the distributions of the current density (corresponding to plasma density distribution) in the radial direction were obtained at a portion (position separated from the top surface by about 5 mm) in the doughnut-shaped plasma. As a result, the profiles shown in FIGS. 10A to 10D were obtained from the respective vertical positions.

In the electromagnetic system simulations, the outer radius of the RF antenna 54 was set to be, e.g., 250 mm; the inner radius and the outer radius of the correction coil 70 were respectively set to be, e.g., 100 mm and 130 mm; and the capacitance of the correction coil 90 (the fixed capacitor 94) was set to be, e.g., 600 pF. As the plasma generated in the doughnut shape by the inductive coupling in the processing space in the chamber which is provided below the RF antenna 54, a disk-shaped resistance 95 was simulated, where its radius, resistivity and skin depth were set to be, e.g., 500 mm, 100 Ωcm and 10 mm, respectively. The plasma-generating RF power $RF_H$ had a frequency of about 13.56 MHz.

When the electromagnetic field simulations were performed under the same conditions except that the capacitance of the correction coil 90 was set to be infinite (corresponding to the case where both ends of the correction coil 90 having no fixed capacitor 94 were short-circuited), the profiles shown in FIGS. 10A to 10D were obtained at the respective vertical positions.

Figure 10A:
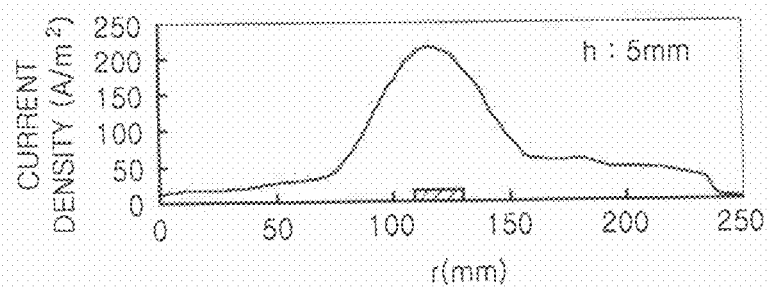
FIGS. 10A to 10D show a state where a radial distribution of a current density in an inductively coupled plasma is changed depending on the vertical position of the correction coil having the fixed capacitor.
Figure 10B:
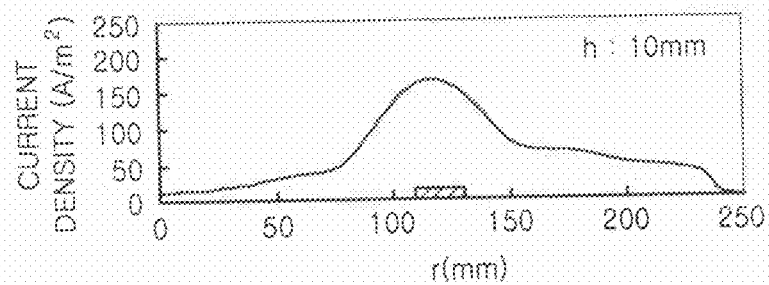
Figure 10C:
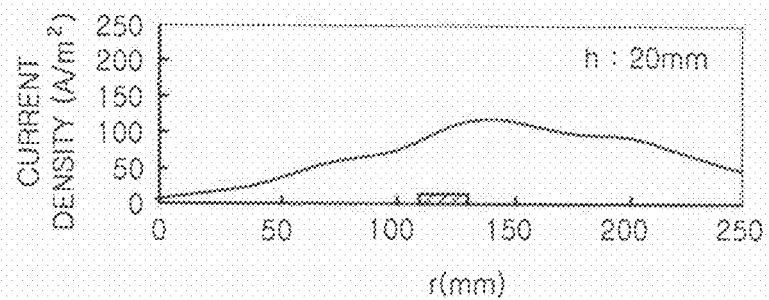
Figure 10D:
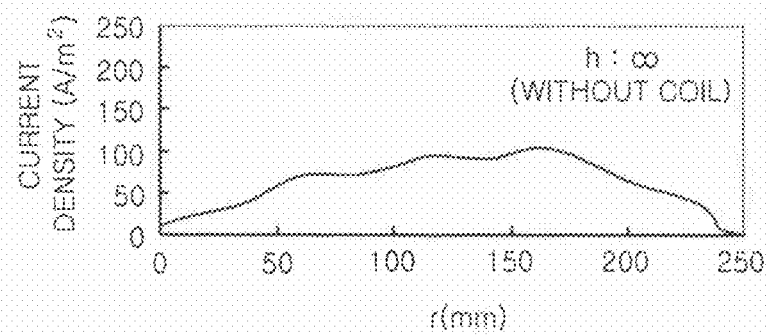

As shown in FIG. 10A, as the correction coil 90 becomes closer to the RF antenna 54, the density distribution of the doughnut-shaped plasma shows a profile in which it was locally increased only at a position (r=110 to 130 mm) overlapped with the coil conductor of the correction coil 90 and, thus, it was more decreased at the radially inner portion and the radially outer portion than that in case that no correction coil 90 was provided. As shown in FIG. 10B, such tendency became weak as the correction coil 90 was separated from the RF antenna 54. Further, as shown in FIG. 10C, when the correction coil 90 was separated from the RF antenna 54 at an appropriate distance (h=20 mm), the plasma density at the radially outer portion (r=130 to 250 mm) became higher than that at the radially inner portion (r=0 to 110 mm) by a few unit scales with respect to the position overlapped with the coil conductor of the correction coil 90 (r=110 to 130 mm).

In the present embodiment, the antenna-coil distance control unit 72 enables the vertical position of the correction coil 90 relative to the RF antenna 54 to be arbitrarily and accurately varied within a predetermined range (e.g., about 1 mm to 50 mm) while maintaining the correction coil 90 in parallel with the horizontal RF antenna 54. Accordingly, the characteristics shown in FIG. 10 which have been verified by the electromagnetic field simulations can be achieved, and the degree of freedom and the accuracy in controlling the plasma density distribution can be improved considerably.

Figure 11:
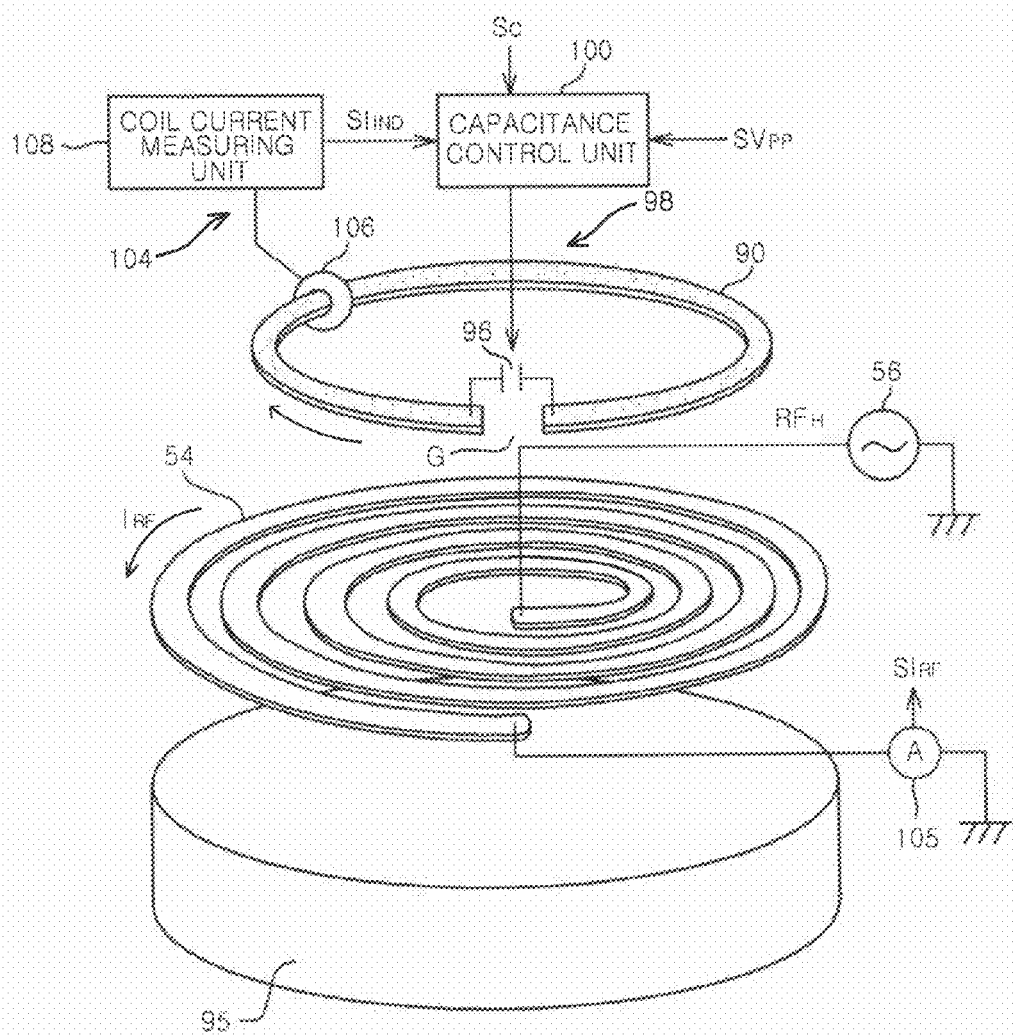
FIG. 11 provides a perspective view schematically showing a configuration of a correction coil having a variable capacitor and an arrangement relationship thereof relative to the RF antenna in accordance with the second embodiment.

The fixed capacitor 94 of the second embodiment can be replaced by a variable capacitor 96. In this case, a capacitance varying mechanism 98 for variably controlling capacitance of the variable capacitor 96 is provided as shown in FIG. 11. The variable capacitor 96 may be of, e.g., a commercially available general purpose type such as a varicon (variable condenser) or a varicap (variable capacitor), or may be a special customized product or a typical product which is assembled as one single unit with the correction coil 90.

The capacitance varying mechanism 98 includes the variable capacitor 96 provided in the loop of the correction coil 90; and a capacitance control unit 100 for variably controlling the capacitance of the variable capacitor 96 typically by using a mechanical driving mechanism or an electric driving circuit.

As for the electrostatic capacitance of the variable capacitor 96, the capacitance control unit 100 receives from the main control unit 74 through the control signal $S_C$ a capacitance setting value, recipe information based on the capacitance setting value, a process parameter and the like. Further, as for a monitoring signal or a feedback signal for variably controlling the coil capacitance, the capacitance control unit 100 receives from a $V_{PP}$ detector 102 (see FIG. 1), a signal $SV_{PP}$ indicating a peak value $V_{PP}$ of an RF voltage obtained immediately before being inputted into the RF antenna 54 and from a coil current measuring unit 104 a signal $SI_{IND}$ indicating a current value (root square value (RMS)) of the induced current $I_{IND}$ flowing in the correction coil 90. Furthermore, a current value (RMS) of the antenna current (RF current) $I_{RF}$ flowing in the RF antenna 54 may be measured by an RF ampere meter 105 to transfer its measured value $SI_{RF}$ to the capacitance control unit 100. As for the $V_{PP}$ detector 102, it is possible to use one provided at the matcher 58 to measure the peak value $V_{PP}$ of the output voltage of the matcher 58. The coil current measuring unit 104 includes, e.g., a current sensor 106 and a coil current measuring circuit 108 for calculating a current value (RMS) of the coil current $I_{IND}$ based on the output signal of the current sensor 106.

Preferably, the capacitance control unit 100 may include a microcomputer and map, e.g., the properties that the current ratio $I_{IND}/I_{RF}$ and the peak value $V_{PP}$ are changeable depending on the coil capacitance, in a table memory. Further, the capacitance control unit 100 may select the most appropriate capacitance of the variable capacitor 96 for a corresponding process or most appropriately dynamically vary the capacitance of the variable capacitor 96 based on information such as a set value (target value), a process recipe, a process parameter or the like obtained from the main control unit 74 and, furthermore, by feedback control or the like performed by using the current monitor unit or the $V_{pp}$ monitor unit.

By independently variably controlling the vertical position and the capacitance of the correction coil 90 having the variable capacitor 96, the degree of freedom and the accuracy in controlling the plasma density distribution can be further improved.

Figure 12:
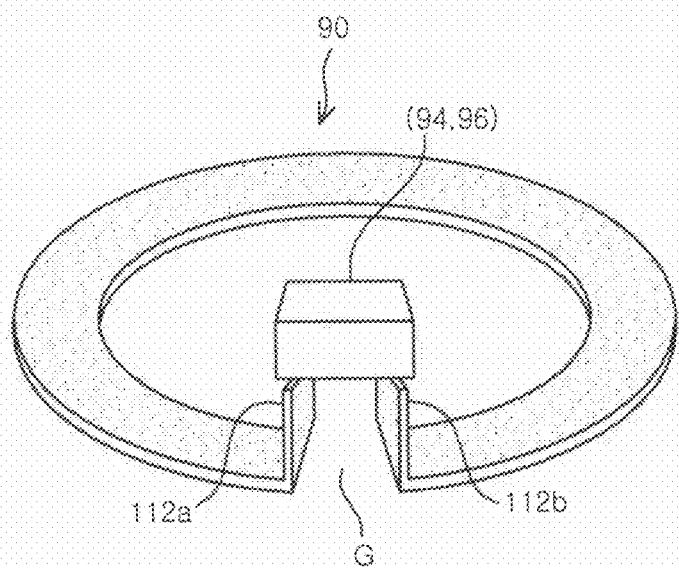
FIG. 12 shows an example of a correction coil having a capacitor.
Figure 13:
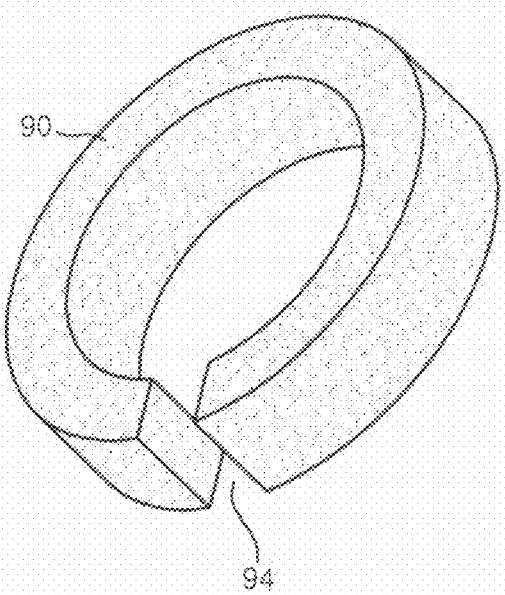
FIG. 13 provides a perspective view showing an example in which a capacitor is assembled as one single unit with a correction coil.

FIGS. 12 and 13 show configuration examples of the correction coil 90 having the capacitor. In the configuration example shown in FIG. 12, a single cutout portion G is formed at the correction coil 90, and commercially available two-terminal capacitors 94 and 96 are attached to the cutout portion G. In the configuration example shown in FIG. 13, the cutout portion G of the correction coil 90 is used as an inter-electrode gap of the fixed capacitor 94. A film made of a dielectric material (not shown) may be inserted into the cutout portion G. In such example, a pair of open end portions of the coil conductor which face each other via the cutout portion G serves as capacitor electrodes. As shown in FIG. B, the electrode area can be controlled to a desired size by attaching an extending portion 120 extending upward (or sideward) thereto as one single unit.

Figure 14:
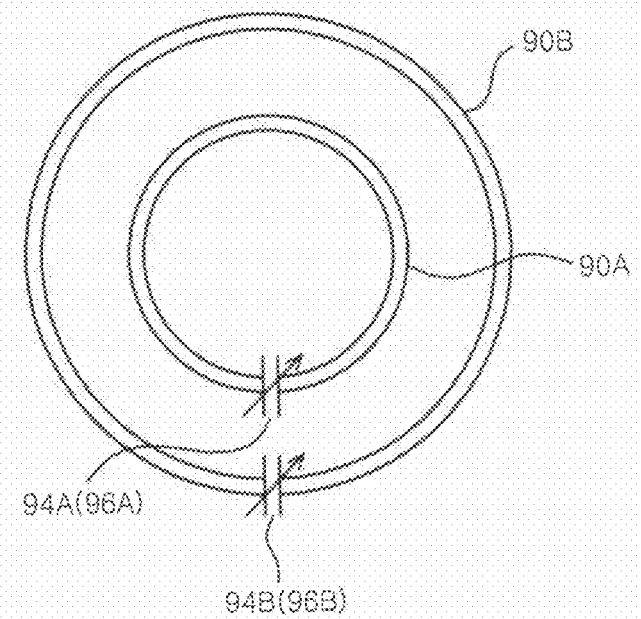
FIG. 14 is a top view showing a structure of a winding structure of the correction coil.

In addition, a plurality of correction coils 90 may be provided. For example, as shown in FIG. 14, two correction coils 90A and 90B having different diameters may be concentrically arranged.

Alternatively, although it is not shown, a plurality of correction coils 90A, 90B, . . . having different vertical positions may be concentrically arranged.

Third Embodiment

Figure 15:
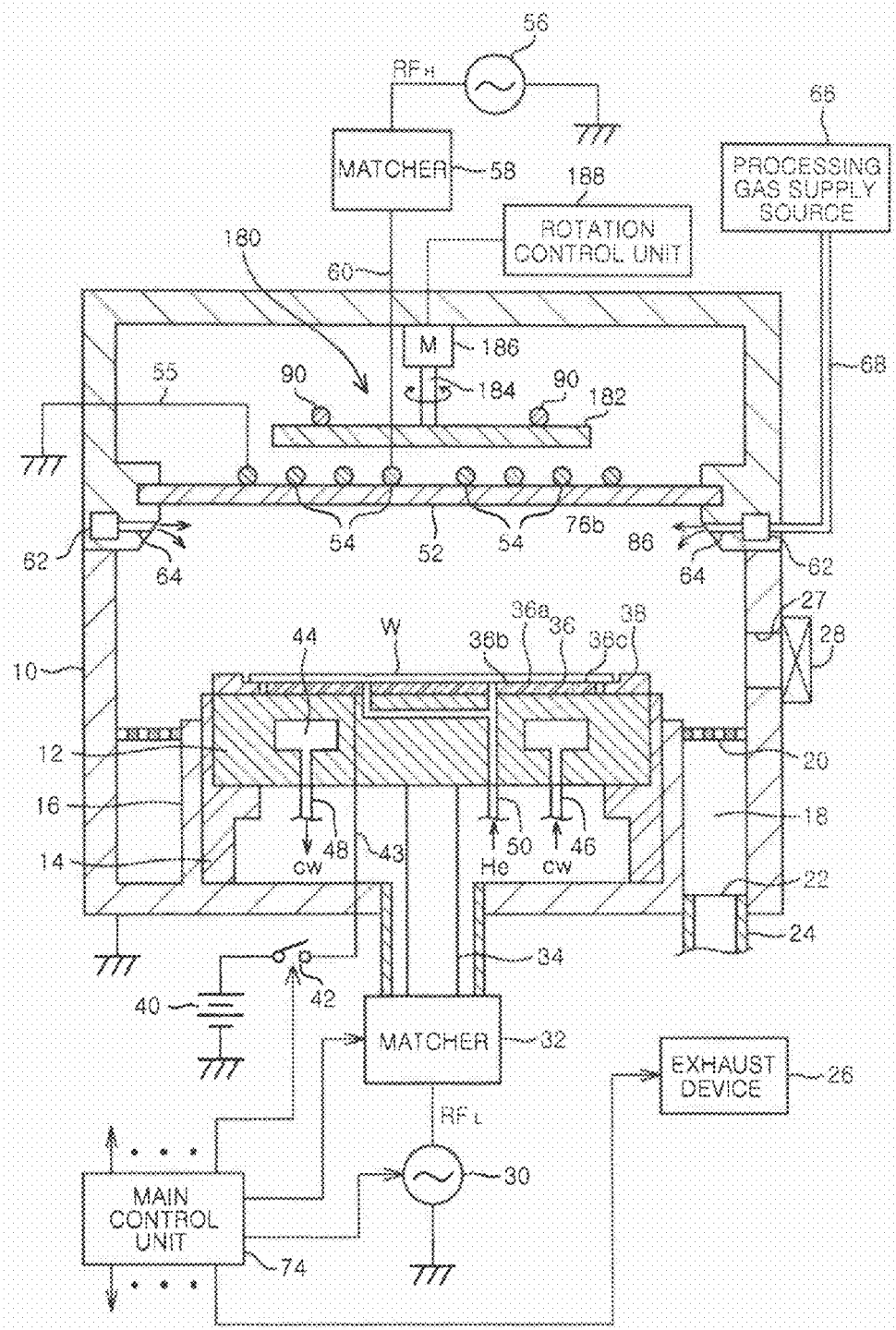
FIG. 15 is a longitudinal cross sectional view showing a configuration of an inductively coupled plasma etching apparatus which further includes a mechanism for rotating or rotationally displacing the correction coil in accordance with a third embodiment of the present invention.

As for the configuration and function of a correction coil and its peripheral units in accordance with a third embodiment of the prevent invention, as shown in FIG. 15, the correction coil of the present invention may be preferably provided with a coil rotation mechanism 180 for rotating or rotatably displacing the correction coil 90 having a capacitor in a concentric positional relationship with the RF antenna 54. The coil rotation mechanism 180 includes, e.g., an insulating substrate support plate 182 for horizontally supporting the correction coil 90 in a concentric positional relationship with the RF antenna 54, a stepping motor 186 coupled with the central portion of the substrate support plate 182 through a vertical rotation shaft 184, and a rotation control unit 188 for controlling the rotation direction, the rotation speed or the rotation angle of the correction coil 90 by using the stepping motor 186. A speed reduction mechanism (not shown) may be provided between the stepping motor 186 and the rotation shaft 184. Moreover, a ground line 55 allows one end (RF output terminal) of the RF antenna 54 to be electrically connected to a ground potential.

Figure 16A:
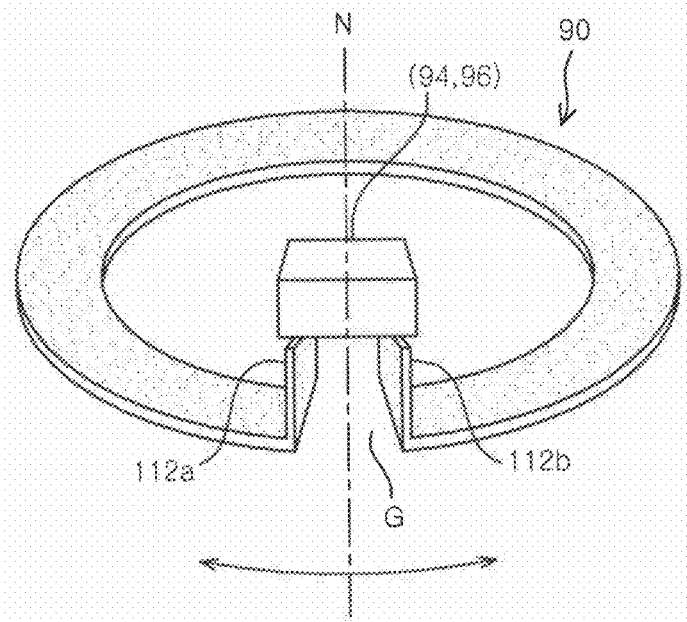
FIG. 16A provides a perspective view showing a state where the correction coil is rotated or rotationally displaced by the coil rotation mechanism shown in FIG. 15.
Figure 16B:
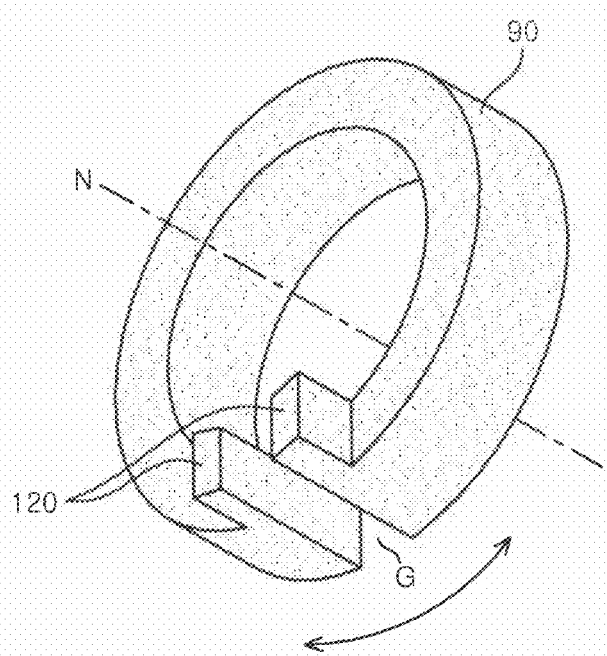
FIG. 16B provides a perspective view showing a state where the correction coil is rotated or rotationally displaced by the coil rotation mechanism shown in FIG. 15.

In accordance with the present embodiment, by providing the coil rotation mechanism 180 having the above configuration, it is possible to rotate the correction coil 90 about a central axial line N thereof and arbitrarily control or select a rotation direction, a rotation speed, a rotation angle, a reciprocating movement or the like of the correction coil 90, as shown in FIGS. 16A and 16B.

For example, when the vicinity of the cutout portion G serves as a space-like singularity in view of the effect of the electrostatic system of the correction coil 90 on the RF antenna 54 or on the plasma in the chamber 10, it is possible to make the plasma uniform at the position of the singularity in the circling direction by constantly rotating the correction coil 90 at a regular speed by the coil rotation mechanism 180, so that the effect of the correction coil having both ends with no cutout portion can be obtained.

Further, a large induced current (at times, larger current than that flowing in the RF antenna) may flow in the correction coil of the present embodiment, so that the heat generation from the correction coil needs to be controlled.

Figure 17A:
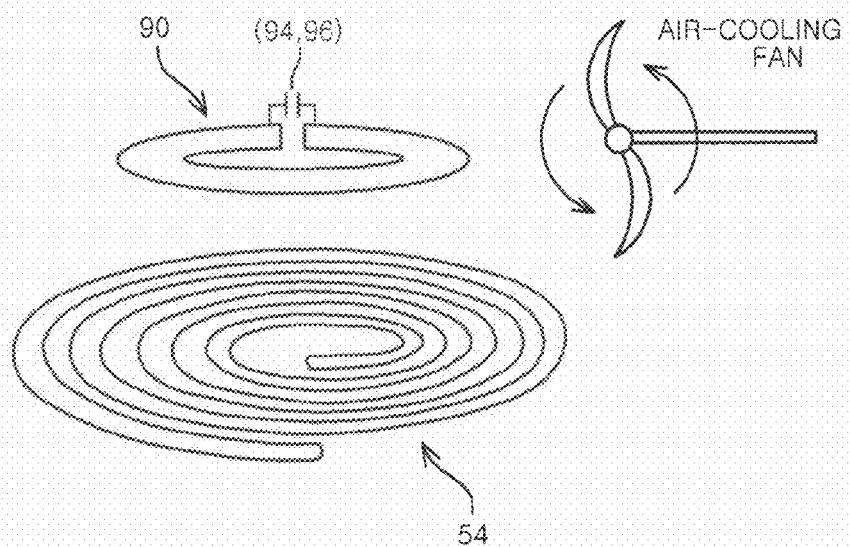
FIG. 17A illustrates a test example in which the correction coil is cooled by air cooling.
Figure 17B:
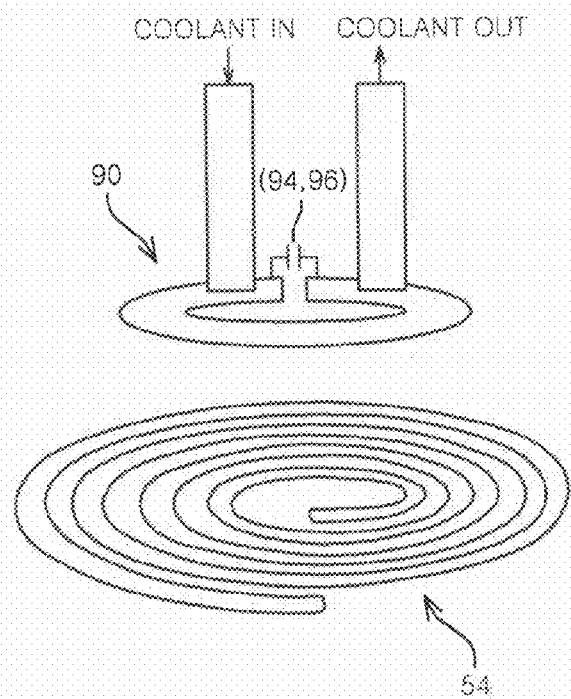
FIG. 17B illustrates a test example in which the correction coil is cooled by a coolant.

In this regard, it is preferable to provide around the correction coil 90 a coil cooling unit for air cooling the correction coil 90 by using a cooling fan installed around the correction coil 90, as shown in FIG. 17A. Alternatively, it is preferable to provide a coil cooling unit for preventing the correction coil 90 from being overheated by supplying a coolant into the correction coil 90 formed of a hollow tube made of copper, as shown in FIG. 17B.

The configuration shown in FIGS. 14 to 17B is related to the correction coil 90 having the capacitor. However, the same configuration may be applied to the correction coil 70 having no capacitor.

Figure 18:
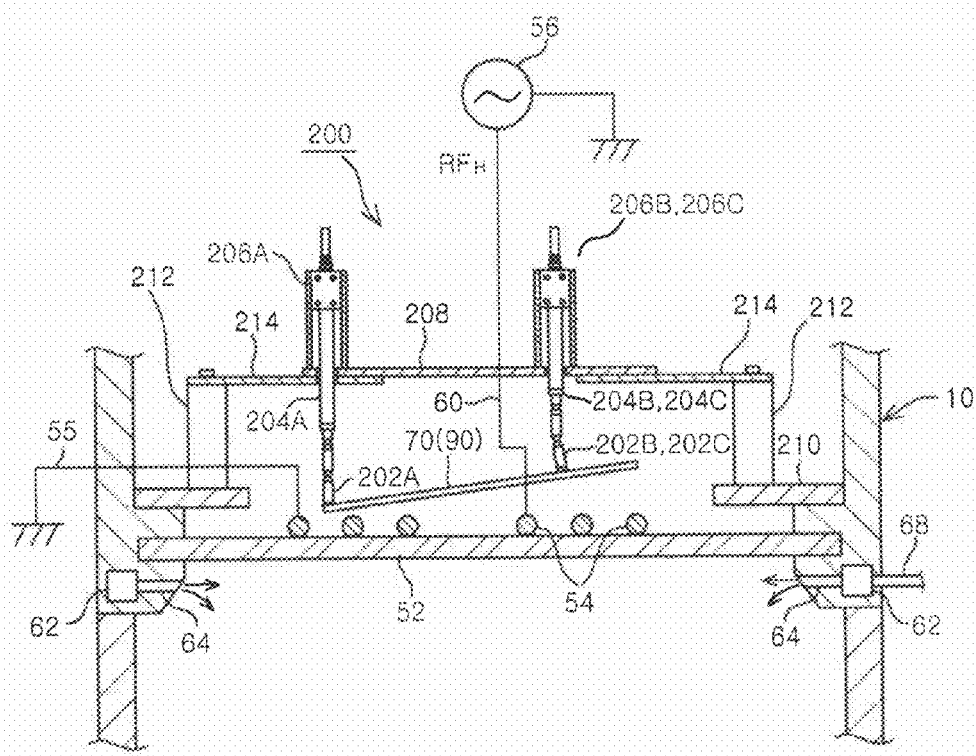
FIG. 18 is a cross sectional view showing a configuration of a coil handling mechanism for executing vertical movement, horizontal posture, arbitrary inclined posture and periodic waving motion of the correction coil in accordance with a fourth embodiment of the present invention.
Figure 19:
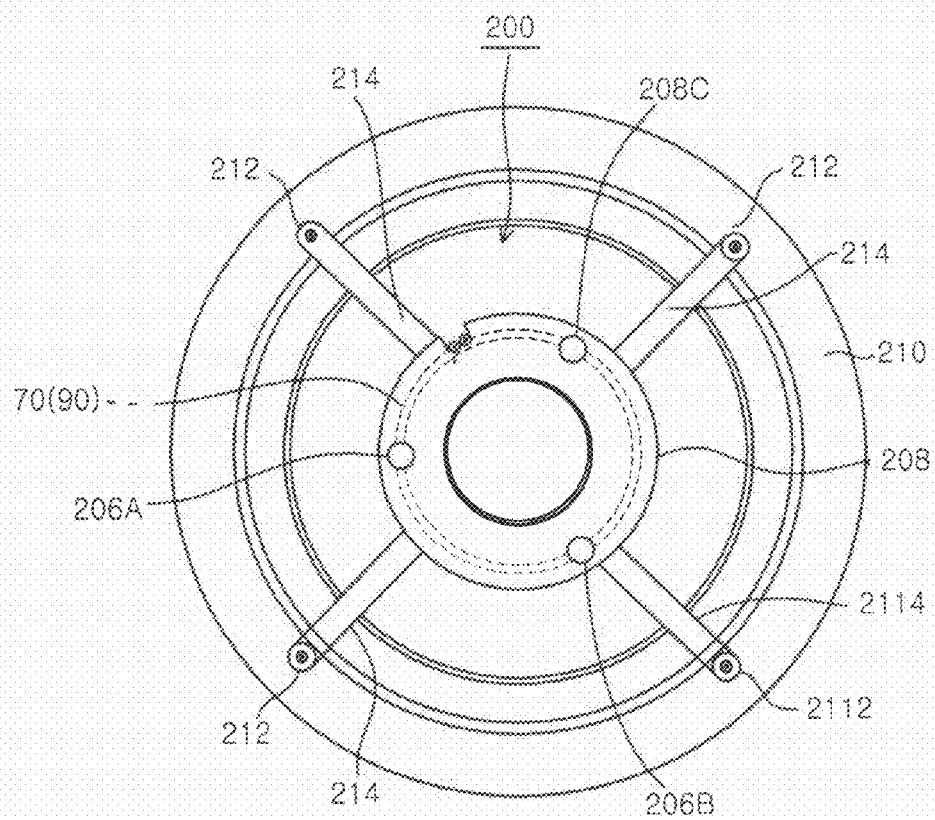
FIG. 19 illustrates a top view showing an installation configuration of the coil handling mechanism.

As for the configuration and function of a correction coil and its peripheral units in accordance with a fourth embodiment of the prevent invention, as shown in FIG. 18, a coil handling mechanism 200 for enabling vertical movement, horizontal posture, arbitrary inclined posture and periodic waving motion of the correction coil 70 (90) may be preferably provided in the antenna chamber provided above the ceiling plate (dielectric window) 52 of the chamber 10.

The coil handling mechanism 200 includes: rod-shaped coil supporting shafts 204A, 204B and 204C coupled with the correction coil 70 (90) by using insulating joints 202A, 202B and 202C, the coil supporting shafts 204A, 204B and 204C being spaced apart from each other at regular intervals along the circling direction; and direct-acting electric actuators 206A, 206B and 206C for respectively extending and contracting or moving back and forth the coil supporting shafts 204A, 204B and 204C in the vertical direction.

While being spaced apart from each other at about 120°, the electric actuators 206A, 206B and 206C are circumferentially attached on the annular support plate 208 installed horizontally above the ceiling plate (dielectric window) 52. Here, the support plate 208 is fixed to the chamber 10 by an annular flange portion 210 coupled with the chamber 10, four column members 212 attached onto the flange portion 210 while being spaced apart from each other at, e.g., 90°, along the circumferential direction, and horizontal beam portions 214 for connecting the column members 212 to the supporting plate 208.

The electric actuators 206A, 206B and 206C enable the coil supporting shafts 204A, 204B and 204C to move back and forth at respective timings, speeds and strokes under the control of the main control unit 74. Each of the joints 202A, 202B and 202C is used to conform to the inclined posture of the correction coil 70 (90), and reduce the stress generated when the posture of the correction coil 70 (90) is changed.

In the coil handling mechanism 200, it is possible to control the correction coil 70 (90) to have a horizontal posture or a posture inclined at an arbitrary angle and direction relative to the RF antenna 54 by respectively controlling the stroke amount (elevation amount) of the coil supporting shafts 204A, 204B and 204C.

Figure 20:
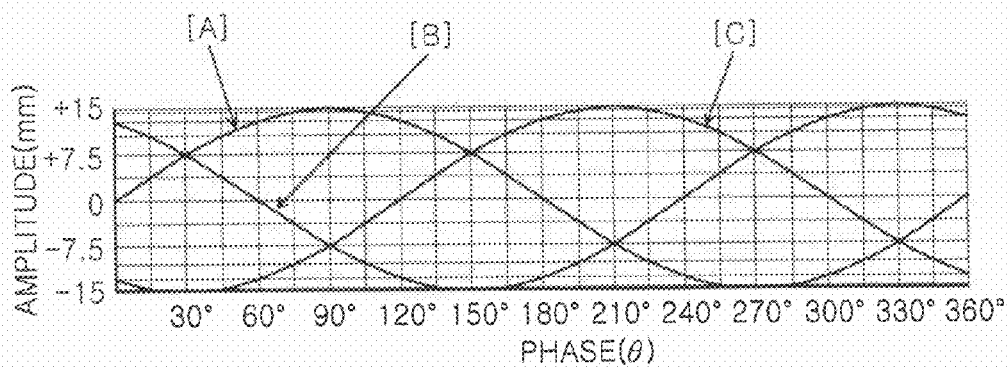
FIG. 20 shows phase-amplitude characteristics in the case of executing periodic waving motion of the correction coil by a three-phase conductive actuator.

Furthermore, by periodically moving back and forth the electric actuators 206A, 206B and 206C and the coil supporting shafts 204A, 204B and 204C at a regular phase difference and a same amplitude, for example as shown in FIG. 20, the periodic waving motion of the correction coil 70 (90) shown in FIGS. 21A and 21B can be performed. FIGS. 21A and 21B schematically show the coil supporting shafts 204A, 204B and 204C, which are indicated by notations [A], [B] and [C]

therein, respectively. In FIGS. 21A and 21B, the phase angle and the amplitude between the coil supporting shafts 204A, 204B and 204C are set to be about 120° and about ±15 mm, respectively. Typically, three-phase driving is used. However, when four-phase driving is used, the phase angle becomes about 90°.

In the periodical waving motion, the central position "○" of the correction coil 70 (90) is fixed or stopped at the position of the vertical position reference value 0, and the highest top position HP (+15 mm) and the lowest bottom position LP (−15 mm) of the correction coil 70 (90) move constantly in the circling direction at a regular speed while facing each other at a position to be symmetric with respect to a point, which is seen as if it is rotated in a wave shape while maintaining a specific inclined posture. In FIGS. 21A and 21B, a straight line BL represents a horizontal line passing through the bottom position LP of the correction coil 70 (90) and rotates on the same plane periodically. In FIGS. 21A and 21B, numerical values of [A], [B], [C] indicate amplitudes of the corresponding supporting shafts 204A, 204B and 204C. For example, (+7.5) indicates +7.5 mm, and (−15) indicates −15 mm.

In the periodical waving movement, the central position "○", the top position HP and the bottom position LP of the correction coil 70 (90) can be changed by differently adjusting the stroke amount (elevation amount) of the coil supporting shafts 204A, 204B and 204C.

By executing the periodical waving motion of the correction coil 70 (90), it is possible to arbitrarily control the effect of the correction coil (the degree of locally decreasing the core plasma density) or easily and accurately improve the uniformity of the plasma density distribution around the substrate in the azimuthal direction.

In the configuration example shown in FIG. 18, the RF antenna 54 is fixed. However, vertical movement, horizontal posture, arbitrary inclined posture or periodical waving motion of the RF antenna 54 can be allowed by installing at the RF antenna 54 an antenna handling mechanism (not shown) having the configuration same as that of the coil handling mechanism 200.

In the aforementioned embodiments of the present invention, the configuration of the inductively coupled plasma etching apparatus is merely an example. Various modifications of the units of the plasma-generation mechanism and units having no direct involvement in the plasma generation may be made.

For example, the basic shapes of the RF antenna 54 and the correction antenna 70 may be, e.g., a domical shape, instead of the planar shape. Further, the RF antenna 54 and the correction antenna 70 may be installed at a portion other than the ceiling portion of the chamber 10. For example, a helical RF antenna may be installed outside a sidewall of the chamber 10.

Besides, it is possible to provide a chamber structure for a rectangular target substrate to be processed, a rectangular RF antenna structure and a rectangular correction coil structure.

Moreover, a processing gas may be supplied through the ceiling of the chamber 10 from the processing gas supply unit, and no DC bias controlling RF power $RF_L$ may be supplied to the susceptor 12. The present invention can be applied to a plasma processing apparatus in which a plurality of RF antennas or antennas•segments are provided; and the plasma-generating RF power is respectively supplied from a plurality of RF power supplies or RF power supply systems to the respective RF antennas (or antenna•segments).

In the above embodiments, the inductively coupled plasma processing apparatus or the plasma processing method therefor is not limited to the technical field of the plasma etching, but is applicable to other plasma processes such as a plasma CVD process, a plasma oxidizing process, a plasma nitriding process and the like. In the embodiments, the target substrate to be processed is not limited to the semiconductor wafer. For example, the target substrate may be one of various kinds of substrates, which can be used in a flat panel display (FPD), a photomask, a CD substrate, a print substrate or the like.

In accordance with an inductively coupled plasma processing apparatus and a plasma processing method therefor of the present invention, it is possible to freely accurately control the plasma density distribution by using a simple correction coil without requiring special processing on the plasma-generating RF antenna or the RF power supply system.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:
    a processing chamber including a dielectric window at a ceiling portion thereof;
    a coil-shaped RF antenna, provided outside the dielectric window;
    a substrate supporting unit, provided in the processing chamber, for mounting thereon a target substrate to be processed;
    a processing gas supply unit for supplying a desired processing gas to the processing chamber to perform a desired plasma process on the target substrate;
    an RF power supply unit for supplying an RF power to the RF antenna to generate a plasma from the processing gas by an inductive coupling in the processing chamber, the RF power having an appropriate frequency for RF discharge of the processing gas;
    a correction coil provided at a position, outside the processing chamber, and above the RF antenna where the correction coil is to be inductively coupled with the RF antenna by electromagnetic induction, the correction coil being configured to locally control a plasma density distribution in the processing chamber; and
    an antenna-coil distance control unit configured to variably control a distance between the RF antenna and the correction coil while supporting the correction coil substantially in parallel with the RF antenna and maintaining the inductive coupling between the correction coil and the RF antenna by electromagnetic induction,
    wherein the correction coil is not connected to any RF power supply unit.

2. The apparatus of claim 1, wherein the RF antenna is provided on the dielectric window, and the antenna-coil distance control unit varies a relative position of the correction coil with respect to the RF antenna by moving up and down at least one of the RF antenna and the correction coil.

3. The apparatus of claim 2, wherein the antenna-coil distance control unit includes:
    an insulating coil supporting body for maintaining the correction coil substantially in parallel with the RF antenna;
    a motor, coupled to the coil supporting body via a ball screw mechanism, for varying a relative position of the correction coil with respect to the RF antenna by rotating a feed screw of the ball screw mechanism; and
    a coil position control unit for controlling the relative position of the correction coil with respect to the RF antenna by adjusting a rotation direction and a rotation amount of the motor.

4. The apparatus of claim 2, wherein the antenna-coil distance control unit includes:
- an insulating coil supporting body for maintaining the correction coil substantially in parallel with the RF antenna;
- a motor, coupled to the coil supporting body via a 3D cam mechanism having a rotating body, for varying a relative position of the correction coil with respect to the RF antenna by rotating the rotating body of the 3D cam mechanism; and
- a coil relative position control unit for controlling the relative position of the correction coil with respect to the RF antenna by adjusting a rotation direction and a rotation amount of the motor.

5. A plasma processing apparatus comprising:
- a processing chamber including a dielectric window at a ceiling portion thereof;
- a coil-shaped RF antenna, provided on the dielectric window;
- a substrate supporting unit, provided in the processing chamber, for mounting thereon a target substrate to be processed;
- a processing gas supply unit for supplying a desired processing gas to the processing chamber to perform a desired plasma process on the target substrate;
- an RF power supply unit for supplying an RF power to the RF antenna to generate a plasma from the processing gas by an inductive coupling in the processing chamber, the RF power having an appropriate frequency for RF discharge of the processing gas;
- a correction coil provided at a position, outside the processing chamber, and above the RF antenna where the correction coil is to be inductively coupled with the RF antenna by electromagnetic induction, the correction coil being configured to locally control a plasma density distribution in the processing chamber; and
- a handling mechanism configured to perform relative vertical movement, horizontal posturing, inclined posturing, or periodical waving motion between the RF antenna and the correction coil while maintaining the inductive coupling between the correction coil and the RF antenna by electromagnetic induction, wherein the correction coil is not connected to any RF power supply unit.

6. The apparatus of claim 1, wherein the correction coil is formed of a single- or a multi-wound coil having opposite open ends, and a capacitor is provided between the open ends of the correction coil.

7. The apparatus of claim 6, wherein the correction coil is arranged to be concentric with the RF antenna, and has a diameter such that a coil conductor is diametrically positioned between an inner periphery and an outer periphery of the RF antenna.

8. The apparatus of claim 6, wherein the capacitor is not connected to the RF power supply unit.

9. The apparatus of claim 1, further comprising a coil cooling unit for cooling the correction coil.

10. The apparatus of claim 5, wherein the correction coil is formed of a single- or a multi-wound coil having opposite open ends, and a capacitor is provided between the open ends of the correction coil.

11. The apparatus of claim 10, wherein the correction coil is arranged to be concentric with the RF antenna, and has a diameter such that a coil conductor is diametrically positioned between an inner periphery and an outer periphery of the RF antenna.

12. The apparatus of claim 10, wherein the capacitor is not connected to the RF power supply unit.

13. The apparatus of claim 5, further comprising a coil cooling unit for cooling the correction coil.

* * * * *